US009394196B2

(12) United States Patent
Peters et al.

(10) Patent No.: US 9,394,196 B2
(45) Date of Patent: Jul. 19, 2016

(54) LOW DENSITY AND HIGH STRENGTH FIBER GLASS FOR REINFORCEMENT APPLICATIONS

(75) Inventors: James Carl Peters, Shelby, NC (US); Juan Camilo Serrano, Gastonia, NC (US); Hong Li, Sewickley, PA (US); Cheryl A. Richards, Monroeville, PA (US); Steven Joel Parks, Lexington, NC (US)

(73) Assignee: PPG Industries Ohio, Inc., Cleveland, OH (US)

( * ) Notice: Subject to any disclaimer, the term of this patent is extended or adjusted under 35 U.S.C. 154(b) by 126 days.

(21) Appl. No.: 13/232,316

(22) Filed: Sep. 14, 2011

(65) Prior Publication Data

US 2012/0064788 A1    Mar. 15, 2012

Related U.S. Application Data

(63) Continuation-in-part of application No. 13/229,012, filed on Sep. 9, 2011, now Pat. No. 8,697,591, which is a continuation-in-part of application No. 12/940,764, filed on Nov. 5, 2010, now Pat. No. 8,697,590, which is a continuation of application No. 11/610,761, filed on Dec. 14, 2006, now Pat. No. 7,829,490.

(60) Provisional application No. 61/382,738, filed on Sep. 14, 2010.

(51) Int. Cl.
| | |
|---|---|
| *B32B 17/04* | (2006.01) |
| *D02G 3/18* | (2006.01) |
| *C03C 12/02* | (2006.01) |
| *C03C 13/00* | (2006.01) |
| *B29C 70/22* | (2006.01) |
| *B29C 70/24* | (2006.01) |
| *F41H 5/04* | (2006.01) |
| *B29K 309/08* | (2006.01) |
| *B29L 31/30* | (2006.01) |
| *H05K 1/03* | (2006.01) |

(52) U.S. Cl.
CPC ............. *C03C 13/00* (2013.01); *B29C 70/22* (2013.01); *B29C 70/24* (2013.01); *D02G 3/18* (2013.01); *F41H 5/0457* (2013.01); *F41H 5/0471* (2013.01); *B29K 2309/08* (2013.01); *B29L 2031/3076* (2013.01); *H05K 1/0366* (2013.01); *Y10T 428/249921* (2015.04); *Y10T 428/298* (2015.01); *Y10T 428/2964* (2015.01); *Y10T 428/31515* (2015.04); *Y10T 442/2934* (2015.04); *Y10T 442/2951* (2015.04); *Y10T 442/2992* (2015.04); *Y10T 442/30* (2015.04); *Y10T 442/3179* (2015.04); *Y10T 442/3195* (2015.04)

(58) Field of Classification Search
CPC .............. C08J 5/08; C08K 3/22; B32B 9/00; B29B 17/00
USPC ................. 501/70, 35, 36; 65/454, 459
See application file for complete search history.

(56) References Cited

U.S. PATENT DOCUMENTS

| | | | |
|---|---|---|---|
| 3,008,841 A | 11/1961 | Tiede | |
| 4,582,748 A | 4/1986 | Eastes et al. | |
| 4,824,806 A | 4/1989 | Yokoi et al. | |
| 5,348,916 A | 9/1994 | Kushitani et al. | |
| 5,369,195 A | 11/1994 | Kelsey | |
| 5,958,808 A | 9/1999 | Mori et al. | |
| 6,060,168 A | 5/2000 | Kohli | |
| 6,169,047 B1 | 1/2001 | Nishizawa et al. | |
| 6,462,147 B1 | 10/2002 | Arata et al. | |
| 6,537,937 B1 | 3/2003 | Nishizawa et al. | |
| 6,846,761 B2 | 1/2005 | Tamura | |
| 6,858,552 B2 | 2/2005 | Peuchert | |
| 6,867,158 B2 | 3/2005 | Peuchert et al. | |
| 7,727,916 B2 | 6/2010 | Peuchert et al. | |
| 7,754,631 B2 | 7/2010 | Maehara et al. | |
| 7,829,490 B2 | 11/2010 | Li et al. | |
| 8,129,299 B2 | 3/2012 | Kishimoto et al. | |
| 8,697,590 B2 | 4/2014 | Li et al. | |
| 8,697,591 B2 | 4/2014 | Li et al. | |
| 2002/0193027 A1 | 12/2002 | Dana et al. | |
| 2003/0054936 A1 | 3/2003 | Tamura | |
| 2004/0175557 A1 | 9/2004 | Creux et al. | |

(Continued)

FOREIGN PATENT DOCUMENTS

| | | |
|---|---|---|
| CA | 2 672 222 | 6/2008 |
| CA | 2 748 000 | 7/2010 |

(Continued)

OTHER PUBLICATIONS

Machine Translation of JP-2003137590 A (May 14, 2003).*
Amendment and Response filed Oct. 22, 2013 for U.S. Appl. No. 13/229,012.
Response to Office Action filed Nov. 5, 2013 for U.S. Appl. No. 12/940,764.

(Continued)

*Primary Examiner* — Jennifer Chriss
*Assistant Examiner* — Ricardo E Lopez
(74) *Attorney, Agent, or Firm* — Kilpatrick Townsend & Stockton LLP

(57) ABSTRACT

The present invention relates to fiber glass strands, yarns, fabrics, composites, prepregs, laminates, fiber-metal laminates, and other products incorporating glass fibers formed from glass compositions. The glass fibers, in some embodiments, are incorporated into composites that can be used in reinforcement applications. Glass fibers formed from some embodiments of the glass compositions can have certain desirable properties that can include, for example, desirable electrical properties (e.g. low $D_k$) or desirable mechanical properties (e.g., specific strength).

22 Claims, No Drawings

(56) References Cited

U.S. PATENT DOCUMENTS

| | | |
|---|---|---|
| 2004/0220039 A1 | 11/2004 | Peuchert |
| 2005/0101469 A1 | 5/2005 | Peuchert et al. |
| 2006/0001005 A1* | 1/2006 | Kishimoto .............. C03C 3/085 252/301.33 |
| 2006/0003884 A1 | 1/2006 | Nishizawa et al. |
| 2006/0160691 A1 | 7/2006 | Kawaguchi et al. |
| 2007/0209401 A1 | 9/2007 | Berthereau et al. |
| 2007/0213194 A1 | 9/2007 | Abensour et al. |
| 2008/0146430 A1 | 6/2008 | Li et al. |
| 2009/0170684 A1 | 7/2009 | Kato et al. |
| 2011/0053755 A1 | 3/2011 | Li et al. |
| 2011/0318561 A1 | 12/2011 | Murata et al. |
| 2012/0058878 A1 | 3/2012 | Li et al. |
| 2012/0060678 A1 | 3/2012 | Peters et al. |
| 2012/0060679 A1 | 3/2012 | Peters et al. |
| 2012/0095149 A1 | 4/2012 | Sawanoi et al. |
| 2013/0029830 A1 | 1/2013 | Koyama et al. |
| 2013/0037105 A1 | 2/2013 | Aitken et al. |

FOREIGN PATENT DOCUMENTS

| | | |
|---|---|---|
| DE | 14 96 520 | 8/1969 |
| DE | 10 2005 019 958 A1 | 11/2006 |
| EP | 0 344 693 | 12/1989 |
| EP | 0 831 072 | 6/1996 |
| GB | 1 006 524 | 10/1965 |
| GB | 1 057 383 | 2/1967 |
| JP | 6-211543 | 8/1994 |
| JP | 6-219780 | 8/1994 |
| JP | 3-409806 | 1/1995 |
| JP | 7-010598 | 1/1995 |
| JP | 2002-080240 | 3/2002 |
| JP | 2002 137937 | 5/2002 |
| JP | 2002-137938 | 5/2002 |
| JP | 2002-154843 | 5/2002 |
| JP | 2002-220255 | 8/2002 |
| JP | 2002-338295 | 11/2002 |
| JP | 2003-137590 | 5/2003 |
| JP | 03137590 A * | 5/2003 |
| JP | 2003-171143 | 6/2003 |
| JP | 2003-321247 | 11/2003 |
| JP | 2009-286686 A | 12/2009 |
| WO | WO 99-52833 | 10/1999 |
| WO | WO 2005/092808 | 10/2005 |
| WO | WO 2008/073558 A1 | 6/2008 |

OTHER PUBLICATIONS

United States Patent and Trademark Office, Response to Office Action, U.S. Appl. No. 12/940,764, filed Jul. 18, 2013.
United States Patent and Trademark Office, Office Action, U.S. Appl. No. 12/940,764, mailed Aug. 5, 2013.
United States Patent and Trademark Office, Response to Office Action, U.S. Appl. No. 12/940,764, filed Nov. 5, 2013.
United States Patent and Trademark Office, Response to Office Action, U.S. Appl. No. 13/229,012, filed Oct. 22, 2013.
United States Patent and Trademark Office, Office Action, U.S. Appl. No. 13/232,614 dated Aug. 5, 2014.
United States Patent and Trademark Office, Office Action, U.S. Appl. No. 13/232,576 dated Aug. 11, 2014.
United States Patent and Trademark Office, Office Action, U.S. Appl. No. 13/232,576 mailed Dec. 2, 2014.
United States Patent and Trademark Office, Response to Office Action, U.S. Appl. No. 13/232,576, filed Nov. 7, 2014.
United States Patent and Trademark Office, Response to Office Action, U.S. Appl. No. 13/232,614, filed Nov. 4, 2014.
United States Patent and Trademark Office, Office Action, U.S. Appl. No. 12/940,764, mailed Apr. 23, 2013.
United States Patent and Trademark Office, Office Action, U.S. Appl. No. 13/229,012, mailed Apr. 24, 2013.
Lowenstein, K., Glass Science and Technology 6, The Manufacturing Technology of Continuous Glass Fibres, Third, completely revised edition, 1993, pp. 33 & 113.
Matsumoto, M. et al., New Low Dielectric Glass (NE-Glass) Fiber Woven Materials for Next Generation Board, ECWC 8, Tokyo 99, p. 2-3-1 thru p. 2-3-4.
Navias, L. et al., Dielectric Properties of Glasses at Ultra-High Frequencies and their Relation to Composition, Journal of American Ceramic Society, 1946, vol. 29, No. 10, pp. 267-276.
E, R, and D Glass Properties, Technical Data Sheet, Saint-Gobain Vetrotex, 2002.
Search Results for International Application No. PCT/US2007/082337 dated Feb. 5, 2008.
Written Opionion of the International Searching Authority for International Application No. PCT/US2007/082337 dated Feb. 5, 2008.
International Preliminary Report on Patentability for International Application PCT/US2007/082337 dated Jun. 16, 2009.
Patent Cooperation Treaty, International Search Report, International Application No. PCT/US2011/051555, mailed Dec. 27, 2011.

* cited by examiner

LOW DENSITY AND HIGH STRENGTH FIBER GLASS FOR REINFORCEMENT APPLICATIONS

CROSS-REFERENCE TO RELATED APPLICATIONS

This application claims priority to U.S. Provisional Patent Application Ser. No. 61/382,738, filed on Sep. 14, 2010, the entire disclosure of which is hereby incorporated by reference. This application claims priority to and is a continuation-in-part of U.S. patent application Ser. No. 13/229,012, filed on Sep. 9, 2011, now U.S. Pat. No. 8,697,591, which issued Apr. 15, 2014 and which is a continuation-in-part of U.S. patent application Ser. No. 12/940,764, filed on Nov. 5, 2010, now U.S. Pat. No. 8,697,590, which issued Apr. 15, 2014 and which is a continuation of U.S. patent application Ser. No. 11/610,761, filed on Dec. 14, 2006, now U.S. Pat. No. 7,829,490, which issued Nov. 9, 2010, the contents of which are each hereby incorporated by reference in their entireties.

FIELD OF INVENTION

The present invention relates to low density and high strength glass fibers and yarns, fabrics, and composites comprising low density and high strength glass fibers adapted for use in reinforcement applications.

BACKGROUND

Glass fibers have been used to reinforce various polymeric resins for many years. Some commonly used glass compositions for use in reinforcement applications include the "E-glass" and "D-glass" families of compositions. Another commonly used glass composition is commercially available from AGY (Aiken, S.C.) under the trade name "S-2 Glass."

Glass fibers have been arranged to form fabrics for many years. In conventional glass fiber weaving operations, a glass fabric is woven by interweaving weft yarns (also referred to as "fill yarns") into a plurality of warp yarns. Generally, this is accomplished by positioning the warp yarns in a generally parallel, planar array on a loom, and thereafter weaving the weft yarns into the warp yarns by passing the weft yarns over and under the warp yarns in a predetermined repetitive pattern. The pattern used will depend upon the desired fabric style.

Warp yarns are typically formed by attenuating a plurality of molten glass streams from a bushing or spinner. Thereafter, a coating (or primary sizing composition) is applied to the individual glass fibers and the fibers are gathered together to form a strand. The strands are subsequently processed into yarns by transferring the strands to a bobbin via a twist frame. During this transfer, the strands can be given a twist to aid in holding the bundle of fibers together. These twisted strands are then wound about the bobbin and the bobbins are used in the weaving processes.

Positioning of the warp yarns on the loom is typically done by way of a loom beam. A loom beam comprises a specified number of warp yarns (also referred to as "ends") wound in an essentially parallel arrangement (also referred to as "warp sheet") about a cylindrical core. Loom beam preparation typically requires combining multiple yarn packages, each package comprising a fraction of the number of ends required for the loom beam, into a single package or loom beam. For example and although not limiting herein, a 50 inch (127 cm) wide, 7781 style fabric which utilizes a DE75 yarn input typically require 2868 ends. However, conventional equipment for forming a loom beam does not allow for all of these ends to be transferred from bobbins to a single beam in one operation. Therefore, multiple beams comprising a fraction of the number of required ends, typically referred to as "section beams," are produced and thereafter combined to form the loom beam. In a manner similar to a loom beam, a section beam typically includes a cylindrical core comprising a plurality of essentially parallel warp yarns wound thereabout. While it will be recognized by one skilled in the art that the section beam can comprise any number of warp yarns required to form the final loom beam, generally the number of ends contained on a section beam is limited by the capacity of the warping creel. For a 7781 style fabric, four section beams of 717 ends each of DE75 are typically provided and when combined offer the required 2868 ends for the warp sheet, as discussed above.

As previously discussed, a primary sizing composition is applied to the glass fibers, typically immediately after forming. Traditionally, the filaments forming the continuous glass fiber strands used in weaving fabric are treated with an aqueous starch-oil sizing, which typically includes partially or fully dextrinized starch or amylose, hydrogenated vegetable oil, a cationic wetting agent, emulsifying agent, and water, as is well known to those skilled in the art. For more information concerning such sizing compositions, see K. Loewenstein, The Manufacturing Technology of Continuous Glass Fibres, (3d Ed. 1993) at pages 237-244, which is specifically incorporated by reference herein. While such sizing compositions are generally robust enough to provide protection to the fibers during fiber forming and loom beam manufacturing processes, they normally are unable to protect the glass fibers, and in particular the warp yarn fibers, from abrasion and wear during high speed weaving. As a result, it is conventional practice in the textile weaving industry to pass the warp yarn through a slasher, which applies a slashing size to the warp yarns during the manufacture of the loom beam to provide the additional protection required, in a manner to be discussed later in more detail. More particularly, the slashing operation provides the vehicle to add additional film forming chemistry to the fibers forming the warp yarn sheet. Typically, the slashing size includes either fully or partially hydrolyzed polyvinyl alcohol (PVA) materials and is a mixture in the 6-8% solids range with a viscosity of 15 to 20 centipoise (CPS). The slashing size is typically applied by submerging the warp yarn sheet in a vessel containing the slashing size via a series of submersion rollers and then passing it through a squeeze roll system, which typically exerts 15 to 20 pounds per square inch of squeezing pressure on the coated yarn in addition to the dead weight of the squeeze roller (the squeeze pressure can vary due to yarn diameter), to remove the excess slashing size. The slashing size can be applied at an elevated temperature, e.g., in the range of 130 to 150° F. (54 to 66° C.) or at room temperature, depending upon the recommendations of the PVA producer. After squeezing the excess size from the yarn sheet, the slashing sized sheet is dried in any convenient manner known in the art, such as but not limited to passing the sheet over heated rollers and/or through a hot air drying oven. In a slasher incorporating heated rollers, or cans, the surface temperature of the cans is typically in the range of 240 to 280° F. (116 to 138° C.). The actual temperature profile of the drying cans depends in part on the can arrangement, number of cans, and yarn speed. In a hot air drying oven, the air temperature within the oven typically ranges from 275 to 300° F. (135 to 149° C.). After drying, the warp yarn sheet passes through a series of split rods to separate the warp sheets and through a hook reed assembly and comb to combine the warp sheets and assure that no ends are adhered to each other. The yarn sheet is then wound onto the loom beam.

Both the primary starch-oil coating and slashing size are not compatible with polymeric resin matrix materials used to impregnate woven fabric incorporating the coated yarns. As a result, these coatings must be removed from the fabric, e.g., by heat cleaning and/or scrubbing, prior to incorporation of a fabric woven from these yarns into the matrix material. For example, a typical one-step heat cleaning process can entail heating the fabric at 600 to 800° F. (316 to 427° C.) for 70-80 hours to remove the starch-oil primary sizing composition and slashing size. In an alternative two-step operation, the fabric is unrolled through an oven where it is exposed to a flame that burns off a portion of the sizes, and then heated at 600 to 800° F. (316 to 427° C.) for 50 to 60 hours. The first step of this two-step operation is sometimes referred to as caramelizing and is typically used to heat clean fabrics woven from coarse yarns, i.e., 7628 style fabric.

When a primary sizing composition that is compatible with the resin matrix material is applied to the individual glass fibers during forming, it has been found that the application of additional slashing size to protect the glass fibers is unnecessary. As a result, the need for additional fiber protection through the application of a slashing size is eliminated. However, it has been observed that when such warp yarns having a resin compatible coating are simply wound onto a loom beam from multiple section beams, for example by passing the warp yarn through a slasher without the addition of slashing size, heating, and drying (sometimes referred to as "dry slashing") to form a loom beam, the number of loom beam defects, such as end breaks due to rolled and twisted ends, is excessive. Rolled ends, which is a condition wherein adjacent glass strands roll on top of each other and are twisted together, are particularly troublesome as they can lead to end breaks during weaving, which in turn are associated with fabric quality issues such as ends out, fuzzy ends, chaffed ends, and undesirable yarn splices.

Nevertheless, the capability to make loom beams with warp yarns having a resin compatible coating on a slasher without using slashing size is important since the main method of forming loom beams in the textile weaving industry is by use of a slasher, and most weaving operations already have this type of equipment.

SUMMARY

Various embodiments of the present invention relate generally to low density and high strength glass fibers, and to fiber glass strands, yarns, fabrics, and composites comprising low density and high strength glass fibers adapted for use in reinforcement applications.

Some embodiments of the present invention relate to fiber glass strands. A number of fiberizable glass compositions are disclosed herein as part of the present invention, and it should be understand that various embodiments of the present invention can comprise glass fibers, fiber glass strands, yarns, and other products incorporating glass fibers formed from such compositions.

In one aspect, a fiber glass strand of the present invention comprises a plurality of glass fibers comprising a glass composition that comprises the following components:

| SiO2 | 60-68 weight percent; |
|---|---|
| B2O3 | 7-12 weight percent; |
| Al2O3 | 9-15 weight percent; |
| MgO | 8-15 weight percent; |
| CaO | 0-4 weight percent; |
| Li2O | 0-2 weight percent; |
| Na2O | 0-1 weight percent; |
| K2O | 0-1 weight percent; |
| Fe2O3 | 0-1 weight percent; |
| F2 | 0-1 weight percent; |
| TiO2 | 0-2 weight percent; and |
| other constituents | 0-5 weight percent total; | wherein the (Li2O+Na2O+K2O) content is less than 2 weight percent and wherein the MgO content is at least twice the content of CaO on a weight percent basis.

In another aspect, a fiber glass strand of the present invention comprises a plurality of glass fibers comprising a glass composition that comprises the following components:

| SiO2 | 53.5-77 weight percent; |
|---|---|
| B2O3 | 4.5-14.5 weight percent; |
| Al2O3 | 4.5-18.5 weight percent; |
| MgO | 4-12.5 weight percent; |
| CaO | 0-10.5 weight percent; |
| Li2O | 0-4 weight percent; |
| Na2O | 0-2 weight percent; |
| K2O | 0-1 weight percent; |
| Fe2O3 | 0-1 weight percent; |
| F2 | 0-2 weight percent; |
| TiO2 | 0-2 weight percent; and |
| other constituents | 0-5 weight percent total. |

In some embodiments, the plurality of glass fibers can have a diameter between about 5 microns and about 13 microns. In some embodiments, the fiber glass strand is at least partially coated with a sizing composition.

Some embodiments of the present invention relate to yarns formed from at least one fiber glass strand formed from a glass composition described herein. Some embodiments of the present invention relate to fabrics incorporating at least one fiber glass strand formed from a glass composition described herein. In some embodiments, a fill yarn used in the fabric can comprise the at least one fiber glass strand. A warp yarn, in some embodiments, can comprise the at least one fiber glass strand. In some embodiments, fiber glass strands can be used in both fill yarns and warp yarns used to form fabrics according to the present invention. In some embodiments, fabrics of the present invention can comprise a plain weave fabric, a twill fabric, a crowfoot fabric, a satin weave fabric, a stitch bonded fabric, or a 3D woven fabric.

Some embodiments of the present invention relate to composites comprising a polymeric resin and glass fibers formed from one of the various glass compositions described herein. The glass fibers can be from a fiber glass strand according to some embodiments of the present invention. In some embodiments, the glass fibers can be incorporated into a fabric, such as a woven fabric. For example, the glass fibers can be in a fill yarn and/or a warp yarn that are woven to form a fabric. In embodiments where the composite comprises a fabric, the fabric can comprise a plain weave fabric, a twill fabric, a crowfoot fabric, a satin weave fabric, a stitch bonded fabric, or a 3D woven fabric. The glass fibers can be incorporated into the composite in other forms as well as discussed in more detail below.

With regard to polymeric resins, composites of the present invention can comprise one or more of a variety of polymeric resins. In some embodiments, the polymeric resin comprises at least one of polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins. The polymeric resin can comprise an epoxy resin in some embodiments.

Composites of the present invention can be in a variety of forms and can be used in a variety of applications. For example, and without limitation, the composites can include aerospace composites, aviation composites, radomes, laminates, fiber-metal laminates, and others. As an example, a fiber-metal laminate can comprise various layers of glass reinforced composites and metal sheets. In one embodiment, a fiber-metal laminate can comprise a prepreg comprising a polymeric resin and a fabric comprising a plurality of glass fibers formed from one of the various glass compositions described herein, a first metal sheet adhesively secured to one surface of the pregreg, and a second metal sheet adhesively secured to a second surface of the prereg, such that the prepreg is positioned between the two metal sheets. In another embodiment, a second prepreg and be positioned between the second metal sheet and a third metal sheet. In one embodiment, the metal sheets can comprise aluminum and the polymeric resin can comprise epoxy.

These and other embodiments are discussed in greater detail in the detailed description which follows.

DETAILED DESCRIPTION

For the purposes of this specification, unless otherwise indicated, all numbers expressing quantities of ingredients, reaction conditions, and so forth used in the specification are to be understood as being modified in all instances by the term "about." Accordingly, unless indicated to the contrary, the numerical parameters set forth in the following specification are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains errors necessarily resulting from the standard deviation found in applicable testing measurements.

It is further noted that, as used in this specification, the singular forms "a," "an," and "the" include plural referents unless expressly and unequivocally limited to one referent.

Reinforcing some materials, such as polymeric resins, with glass fibers can result in composites having improved impact resistance and/or other desirable mechanical properties. For some glass fiber reinforcement applications, it may be desirable to use stronger, lighter weight, and more cost effective glass fibers. The combination of high strength and/or high modulus with low density can be especially important for some aerospace and transportation applications, in which weight is often an important design parameter. Compared to glass fibers comprising E-glass, glass fibers useful in some embodiments of the present invention can exhibit high strain-to-failure, high strength, and/or low fiber density, which combination can result in glass fiber-reinforced composites having a lower areal density for a given fiber volume fraction or a given composite performance. In some embodiments, the glass fibers may be first arranged into a fabric. In some embodiments, glass fibers of the present invention can be provided in other forms including, for example and without limitation, as chopped strands (dry or wet), yarns, wovings, prepregs, etc. In short, various embodiments of the glass compositions (and any fibers formed therefrom) can be used in a variety of applications.

Fiberizable glass compositions have been developed which provide improved electrical performance (i.e., low dielectric constant, $D_k$, and/or low dissipation factor, $D_f$) relative to standard E-glass, while providing temperature-viscosity relationships that are more conducive to commercially practical fiber forming than previous low $D_k$ glass proposals. Such glass compositions are described in U.S. Pat. No. 7,829,490 and U.S. patent application Ser. No. 13/229,012, filed Sep. 9, 2011, both of which are incorporated herein by reference in their entireties. Another optional aspect of the glass compositions described in U.S. Pat. No. 7,829,490 and U.S. patent application Ser. No. 13/229,012 is that at least some of the compositions can be made commercially with relatively low raw material batch cost.

Some embodiments of the present invention relate to fiber glass strands. Some embodiments of the present invention relate to yarns comprising fiber glass strands. Some embodiments of yarns of the present invention are particularly suitable for weaving applications. In addition, some embodiments of the present invention relate to glass fiber fabrics. Some embodiments of glass fiber fabrics of the present invention are particularly suitable for use in reinforcement applications, especially reinforcement applications in which low density and high modulus, high strength, and/or high strain-to-failure are important. Further, some embodiments of the present invention relate to composites that incorporate fiber glass strands, glass fiber yarns, and glass fiber fabrics, such as fiber reinforced polymer composites. Some composites of the present invention are particularly suitable for use in reinforcement applications, especially reinforcement applications in which low density and high modulus, high strength, and/or high strain-to-failure are important, such as aerospace, aviation, wind energy, radome, and other applications. Some composites of the present invention may be especially suitable for use in any application in which high impact resistance and low density are desirable. Exemplary applications include, among others, aerospace applications, aviation applications, automobile applications, shipping applications, wind energy applications, bridge construction, and radomes. Some embodiments of the present invention relate to aerospace composites. Other embodiments of the present application relate to aviation composites. Still other embodiments of the present invention relate to composites suitable for use in wind energy applications. Some embodiments of the present invention relate to prepregs. Other embodiments of the present invention relate to laminates. Some embodiments of the present invention relate to fiber-metal laminates (e.g., fiber glass prepregs positioned between metal sheets) that can be used, for example, in secondary aircraft structures. Other embodiments of the present invention relate to radomes.

Some embodiments of the present invention relate to fiber glass strands. In some embodiments, a fiber glass strand of the present invention comprises a plurality of glass fibers comprising a glass composition that comprises the following components:

| | |
|---|---|
| $SiO_2$ | 60-68 weight percent; |
| $B_2O_3$ | 7-12 weight percent; |
| $Al_2O_3$ | 9-15 weight percent; |

-continued

| | |
|---|---|
| MgO | 8-15 weight percent; |
| CaO | 0-4 weight percent; |
| Li$_2$O | 0-2 weight percent; |
| Na$_2$O | 0-1 weight percent; |
| K$_2$O | 0-1 weight percent; |
| Fe$_2$O$_3$ | 0-1 weight percent; |
| F$_2$ | 0-1 weight percent; |
| TiO$_2$ | 0-2 weight percent; and |
| other constituents | 0-5 weight percent total. |

In some embodiments, the (Li$_2$O+Na$_2$O+K$_2$O) content can be less than 2 weight percent and the MgO content can be at least twice the content of CaO on a weight percent basis.

In some embodiments, a fiber glass strand of the present invention comprises a plurality of glass fibers comprising a glass composition that comprises the following components:

| | |
|---|---|
| SiO$_2$ | 53.5-77 weight percent; |
| B$_2$O$_3$ | 4.5-14.5 weight percent; |
| Al$_2$O$_3$ | 4.5-18.5 weight percent; |
| MgO | 4-12.5 weight percent; |
| CaO | 0-10.5 weight percent; |
| Li$_2$O | 0-4 weight percent; |
| Na$_2$O | 0-2 weight percent; |
| K$_2$O | 0-1 weight percent; |
| Fe$_2$O$_3$ | 0-1 weight percent; |
| F$_2$ | 0-2 weight percent; |
| TiO$_2$ | 0-2 weight percent; and |
| other constituents | 0-5 weight percent total. |

In some embodiments, a fiber glass strand of the present invention comprises a glass composition comprising:

| | |
|---|---|
| SiO$_2$ | 60-68 weight percent; |
| B$_2$O$_3$ | 7-12 weight percent; |
| Al$_2$O$_3$ | 9-15 weight percent; |
| MgO | 8-15 weight percent; |
| CaO | 0-4 weight percent; |
| Li$_2$O | >0-2 weight percent; |
| Na$_2$O | 0-1 weight percent; |
| K$_2$O | 0-1 weight percent; |
| Fe$_2$O$_3$ | 0-1 weight percent; |
| F$_2$ | 0-1 weight percent; |
| TiO$_2$ | 0-2 weight percent; and |
| other constituents | 0-5 weight percent total; | wherein the Li$_2$O content is greater than either the Na$_2$O content or the K$_2$O content.

A number of other glass compositions are disclosed herein as part of the present invention, and other embodiments of the present invention relate to fiber glass strands formed from such compositions.

In some embodiments, fiber glass strands formed from glass compositions described herein can exhibit desirable properties, such as improved fiber strength, Young's modulus, failure strain, and/or linear coefficient of thermal expansion, while also exhibiting relatively low density. Fiber glass strands comprising other glass compositions as disclosed herein may also exhibit one or more such desirable properties.

Fiber glass strands can comprise glass fibers of various diameters, depending on the desired application. In some embodiments, a fiber glass strand of the present invention comprises at least one glass fiber having a diameter between about 5 and about 13 μm. In other embodiments, the at least one glass fiber has a diameter between about 5 and about 7 μm.

In some embodiments, fiber glass strands of the present invention can be formed into rovings. Rovings can comprise assembled, multi-end, or single-end direct draw rovings. Rovings comprising fiber glass strands of the present invention can comprise direct draw single-end rovings having various diameters and densities, depending on the desired application. In some embodiments, a roving comprising fiber glass strands of the present invention exhibits a density up to about 112 yds/lb.

Some embodiments of the present invention relate to yarns comprising at least one fiber glass strand as disclosed herein. In some embodiments, a yarn of the present invention comprises at least one fiber glass strand comprising a glass composition that comprises 60-68 weight percent SiO$_2$, 7-12 weight percent B$_2$O$_3$, 9-15 weight percent Al$_2$O$_3$, 8-15 weight percent MgO, 0-4 weight percent CaO, 0-2 weight percent Li$_2$O, 0-1 weight percent Na$_2$O, 0-1 weight percent K$_2$O, 0-1 weight percent F$_2$O$_3$, 0-1 weight percent F$_2$, 0-2 weight percent TiO$_2$, and 0-5 weight percent total other constituents. A yarn, in some embodiments, comprises at least one fiber glass strand comprising a glass composition that comprises 53.5-77 weight percent SiO$_2$, 4.5-14.5 weight percent B$_2$O$_3$, 4.5-18.5 weight percent Al$_2$O$_3$, 4-12.5 weight percent MgO, 0-10.5 weight percent CaO, 0-4 weight percent Li$_2$O, 0-2 weight percent Na$_2$O, 0-1 weight percent K$_2$O, 0-1 weight percent F$_2$O$_3$, 0-2 weight percent F$_2$, 0-2 weight percent TiO$_2$, and 0-5 weight percent total other constituents. In other embodiments, a yarn of the present invention can comprise at least one fiber glass strand comprising one of the other glass compositions disclosed herein as part of the present invention.

In some embodiments, a yarn of the present invention comprises at least one fiber glass strand as disclosed herein, wherein the at least one fiber glass strand is at least partially coated with a sizing composition. In some embodiments, the sizing composition is compatible with a thermosetting polymeric resin. In other embodiments, the sizing composition can comprise a starch-oil sizing composition.

Yarns can have various linear mass densities, depending on the desired application. In some embodiments, a yarn of the present invention has a linear mass density from of 5,000 yds/lb to about 10,000 yds/lb.

Yarns can have various twist levels and directions, depending on the desired application. In some embodiments, a yarn of the present invention has a twist in the z direction of about 0.5 to about 2 turns per inch. In other embodiments, a yarn of the present invention has a twist in the z direction of about 0.7 turns per inch.

Yarns can be made from one or more strands that are twisted together and/or plied, depending on the desired application. Yarns can be made from one or more strands that are twisted together but not plied; such yarns are known as "singles." Yarns of the present invention can be made from one or more strands that are twisted together but not plied. In some embodiments, yarns of the present invention comprise 1-4 strands twisted together. In other embodiments, yarns of the present invention comprise 1 twisted strand.

Some embodiments of yarns comprising glass compositions of the present invention can demonstrate improved break load retention following heat cleaning and finishing as compared to yarns made from conventional glass compositions.

Some embodiments of the present invention relate to fabrics comprising at least one fiber glass strand. In some embodiments, a fabric comprises at least one fiber glass strand comprising a glass composition that comprises 60-68 weight percent SiO$_2$, 7-12 weight percent B$_2$O$_3$, 9-15 weight percent Al$_2$O$_3$, 8-15 weight percent MgO, 0-4 weight percent CaO, 0-2 weight percent Li$_2$O, 0-1 weight percent Na$_2$O, 0-1 weight percent $K_2O$, 0-1 weight percent $F_2O_3$, 0-1 weight percent $F_2$, 0-2 weight percent $TiO_2$, and 0-5 weight percent total other constituents. A fabric, in some embodiments, comprises at least one fiber glass strand comprising a glass composition that comprises 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, a fabric of the present invention can comprise at least one fiber glass strand comprising one of the other glass compositions disclosed herein as part of the present invention. In some embodiments, a fabric of the present invention comprises a yarn as disclosed herein. Fabrics of the present invention, in some embodiments, can comprise at least one fill yarn comprising at least one fiber glass strand as disclosed herein. Fabrics of the present invention, in some embodiments, can comprise at least one warp yarn comprising at least one fiber glass strand as disclosed herein. In some embodiments, a fabric of the present invention comprises at least one fill yarn comprising at least one fiber glass strand as disclosed herein and at least one warp yarn comprising at least one fiber glass strand as disclosed herein.

In some embodiments of the present invention comprising a fabric, the glass fiber fabric is a fabric woven in accordance with industrial fabric style no. 7781. In other embodiments, the fabric comprises a plain weave fabric, a twill fabric, a crowfoot fabric, a satin weave fabric, a stitch bonded fabric (also known as a non crimp fabric), or a "three-dimensional" woven fabric.

Some embodiments of the present invention relate to composites. In some embodiments, a composite of the present invention comprises a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. A composite of the present invention, in some embodiments, comprises a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, a composite of the present invention can comprise a polymeric resin and a plurality of glass fibers disposed in the polymeric resin, wherein at least one of the plurality of glass fibers was formed from one of the other glass compositions disclosed herein as part of the present invention. In some embodiments, a composite of the present invention comprises a polymeric resin and at least one fiber glass strand as disclosed herein disposed in the polymeric resin. In some embodiments, a composite of the present invention comprises a polymeric resin and at least a portion of a roving comprising at least one fiber glass strand as disclosed herein disposed in the polymeric resin. In other embodiments, a composite of the present invention comprises a polymeric resin and at least one yarn as disclosed herein disposed in the polymeric resin. In still other embodiments, a composite of the present invention comprises a polymeric resin and at least one fabric as disclosed herein disposed in the polymeric resin. In some embodiments, a composite of the present invention comprises at least one fill yarn comprising at least one fiber glass strand as disclosed herein and at least one warp yarn comprising at least one fiber glass strand as disclosed herein.

Composites of the present invention can comprise various polymeric resins, depending on the desired properties and applications. In some embodiments of the present invention comprising a composite, the polymeric resin comprises an epoxy resin. In other embodiments of the present invention comprising a composite, the polymeric resin can comprise polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins.

Some embodiments of the present invention relate to aerospace composites. In some embodiments, an aerospace composite of the present invention exhibits properties desirable for use in aerospace applications, such as high modulus, high failure-to-strain, and/or low density. The low density of some aerospace composites of the present invention can make such composites especially desirable for use in aerospace applications in which reducing weight is important. Aerospace composites of the present invention can also cost less than other composites used in aerospace applications.

In some embodiments, an aerospace composite of the present invention comprises a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. An aerospace composite of the present invention, in some embodiments, comprises a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, an aerospace composite of the present invention can comprise a polymeric resin and a plurality of glass fibers disposed in the polymeric resin, wherein at least one of the plurality of glass fibers was formed from one of the other glass compositions disclosed herein as part of the present invention.

In some embodiments, an aerospace composite of the present invention comprises a polymeric resin and at least one fiber glass strand as disclosed herein disposed in the polymeric resin. In some embodiments, an aerospace composite of the present invention comprises a polymeric resin and at least a portion of a roving comprising at least one fiber glass strand as disclosed herein disposed in the polymeric resin. In other embodiments, an aerospace composite of the present invention comprises a polymeric resin and at least one yarn as disclosed herein disposed in the polymeric resin. In still other embodiments, an aerospace composite of the present invention comprises a polymeric resin and at least one fabric as disclosed herein disposed in the polymeric resin. In some embodiments, an aerospace composite of the present invention comprises at least one fill yarn comprising at least one fiber glass strand as disclosed herein and at least one warp yarn comprising at least one fiber glass strand as disclosed herein.

Aerospace composites of the present invention can comprise various polymeric resins, depending on the desired properties and applications. In some embodiments of the present invention comprising an aerospace composite, the polymeric resin comprises an epoxy resin. In other embodiments of the present invention comprising an aerospace composite, the polymeric resin can comprise polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins. Examples of parts in which aerospace composites of the present invention might be used can include, but are not limited to floor panels, overhead bins, galleys, seat back, and other internal compartments that are potentially prone to impact, as well as external components such as helicopter rotor blades.

Some embodiments of the present invention relate to aviation composites. In some embodiments, an aviation composite of the present invention exhibits properties desirable for use in aviation applications, such as high modulus, high failure-to-strain, and/or low density. The high failure-to-strain of some aviation composites of the present invention can make such composites especially desirable for use in aviation applications in which high impact resistance is important, such as aircraft interior applications. In some embodiments, aviation composites of the present invention can demonstrate increased impact performance as compared to composites formed from E-glass fabrics. Aviation composites of the present invention can also cost less than other composites used in aviation applications. Aviation composites of the present invention can be suitable for use in aircraft interiors (including, among other things, luggage storage bins, seats, and floors).

In some embodiments, an aviation composite of the present invention comprises a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. An aviation composite of the present invention, in some embodiments, comprises a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, an aviation composite of the present invention can comprise a polymeric resin and a plurality of glass fibers disposed in the polymeric resin, wherein at least one of the plurality of glass fibers was formed from one of the other glass compositions disclosed herein as part of the present invention.

In some embodiments, an aviation composite of the present invention comprises a polymeric resin and at least one fiber glass strand as disclosed herein disposed in the polymeric resin. In some embodiments, an aviation composite of the present invention comprises a polymeric resin and at least a portion of a roving comprising at least one fiber glass strand as disclosed herein disposed in the polymeric resin. In other embodiments, an aviation composite of the present invention comprises a polymeric resin and at least one yarn as disclosed herein disposed in the polymeric resin. In still other embodiments, an aviation composite of the present invention comprises a polymeric resin and at least one fabric as disclosed herein disposed in the polymeric resin. In some embodiments, an aviation composite of the present invention comprises at least one fill yarn comprising at least one fiber glass strand as disclosed herein and at least one warp yarn comprising at least one fiber glass strand as disclosed herein.

Aviation composites of the present invention can comprise various polymeric resins, depending on the desired properties and applications. In some embodiments of the present invention comprising an aviation composite, the polymeric resin comprises a phenolic resin. In other embodiments of the present invention comprising an aviation composite, the polymeric resin can comprise epoxy, polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins. Examples of parts in which aerospace composites of the present invention might be used can include, but are not limited to floor panels, overhead bins, galleys, seat back, and other internal compartments that are potentially prone to impact, as well as external components such as helicopter rotor blades.

Some embodiments of the present invention relate to composites that can be used in wind energy applications. In some embodiments, a composite of the present invention suitable for use in wind energy applications exhibits properties desirable for use in wind energy applications, such as high modulus/high failure-to-strain and low density. Composites of the present invention suitable for use in wind energy applications can also cost less than other composites used in wind energy applications. Composites of the present invention can be suitable for use in wind turbine blades, particularly long wind turbine blades that are lighter weight but still strong compared to other long wind turbine blades.

In some embodiments, a composite of the present invention suitable for use in wind energy applications comprises a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. A composite of the present invention suitable for use in wind energy applications, in some embodiments, comprises a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, an aviation composite of the present invention can comprise a polymeric resin and a plurality of glass fibers disposed in the polymeric resin, wherein at least one of the plurality of glass fibers was formed from one of the other glass compositions disclosed herein as part of the present invention.

In some embodiments, a composite of the present invention suitable for use in wind energy applications comprises a polymeric resin and at least one fiber glass strand as disclosed herein disposed in the polymeric resin. In some embodiments, a composite of the present invention suitable for use in wind energy applications comprises a polymeric resin and at least a portion of a roving comprising at least one fiber glass strand as disclosed herein disposed in the polymeric resin. In other embodiments, a composite of the present invention suitable for use in wind energy applications comprises a polymeric resin and at least one yarn as disclosed herein disposed in the polymeric resin. In still other embodiments, a composite of the present invention suitable for use in wind energy applications comprises a polymeric resin and at least one fabric as disclosed herein disposed in the polymeric resin. In some embodiments, a composite of the present invention suitable for use in wind energy applications comprises at least one fill yarn comprising at least one fiber glass strand as disclosed herein and at least one warp yarn comprising at least one fiber glass strand as disclosed herein.

Composites of the present invention suitable for use in wind energy applications can comprise various polymeric resins, depending on the desired properties and applications. In some embodiments of the present invention comprising a composite suitable for use in wind energy applications, the polymeric resin comprises an epoxy resin. In other embodiments of the present invention comprising a composite suitable for use in wind energy applications, the polymeric resin can comprise polyester resins, vinyl esters, thermoset polyurethanes, or polydicyclopentadiene resins.

Some embodiments of the present invention relate to laminates. Laminates of the present invention can comprise a plurality of sheet-like layers combined to form a laminate. In some embodiments, a laminate of the present invention comprises at least one layer comprising a composite as described herein. In some embodiments, a laminate of the present invention comprises at least one layer comprising a composite comprising a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. A laminate of the present invention, in some embodiments, comprises at least one layer comprising a composite comprising a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, a laminate of the present invention can comprise at least one layer comprising a composite comprising a polymeric resin and a plurality of glass fibers disposed in the polymeric resin, wherein at least one of the plurality of glass fibers was formed from one of the other glass compositions disclosed herein as part of the present invention.

In some embodiments, a laminate of the present invention comprises a composite comprising a polymeric resin and at least one fiber glass strand as disclosed herein disposed in the polymeric resin. In some embodiments, a laminate of the present invention comprises a polymeric resin and at least a portion of a roving comprising at least one fiber glass strand as disclosed herein disposed in the polymeric resin. In other embodiments, a laminate of the present invention comprises a composite comprising a polymeric resin and at least one yarn as disclosed herein disposed in the polymeric resin. In still other embodiments, a laminate of the present invention comprises a composite comprising a polymeric resin and at least one fabric as disclosed herein disposed in the polymeric resin. In some embodiments, a laminate of the present invention comprises at least one fill yarn comprising at least one fiber glass strand as disclosed herein and at least one warp yarn comprising at least one fiber glass strand as disclosed herein.

Laminates of the present invention can comprise various polymeric resins, depending on the desired properties and applications. In some embodiments of the present invention comprising a laminate, the polymeric resin comprises an epoxy resin. In other embodiments of the present invention comprising a composite, the polymeric resin can comprise polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins.

Some embodiments of the present invention relate to prepregs. Prepregs of the present invention can comprise a polymeric resin and at least one fiber glass strand as disclosed herein. In some embodiments, a prepreg of the present invention comprises a polymeric resin and a plurality of glass fibers in contact with the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. A prepreg of the present invention, in some embodiments, comprises a polymeric resin and a plurality of glass fibers in contact with the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, a prepreg of the present invention can comprise a polymeric resin and a plurality of glass fibers in contact with the polymeric resin, wherein at least one of the plurality of glass fibers was formed from one of the other glass compositions disclosed herein as part of the present invention.

In some embodiments, a prepreg of the present invention comprises a polymeric resin and at least one fiber glass strand as disclosed herein in contact with the polymeric resin. In some embodiments, a prepreg of the present invention comprises a polymeric resin and at least a portion of a roving comprising at least one fiber glass strand as disclosed herein disposed in the polymeric resin. In other embodiments, a prepreg of the present invention comprises a polymeric resin and at least one yarn as disclosed herein in contact with the polymeric resin. In still other embodiments, a prepreg of the present invention comprises a polymeric resin and at least one fabric as disclosed herein in contact with the polymeric resin. In some embodiments, a prepreg of the present invention comprises at least one fill yarn comprising at least one fiber glass strand as disclosed herein and at least one warp yarn comprising at least one fiber glass strand as disclosed herein.

Prepregs of the present invention can comprise various polymeric resins, depending on the desired properties and applications. In some embodiments of the present invention comprising a prepreg, the polymeric resin comprises an epoxy resin. In other embodiments of the present invention comprising a prepreg, the polymeric resin can comprise polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins.

Prepregs, in some embodiments of the present invention, can be incorporated into other products. For example, in some embodiments, prepregs of the present invention can be incorporated into a fiber-metal laminate. Incorporating a prepreg of the present invention into a fiber-metal laminate can be advantageous because, in some embodiments, the prepreg can have excellent crack arresting properties and specific gravity relative to the metal sheets that might be used (e.g., an aluminum alloy sheet). Several fiber-metal laminates, such as GLARE and ARALL, are well-known, and prepregs of the present invention can readily be incorporated into those structures. Fiber-metal laminates such as GLARE ("Glass Laminate Aluminum Reinforced Epoxy") and ARALL (an aramid fiber-based fiber-metal laminate) were developed as lightweight fuselage materials for aerospace applications with GLARE generally directed towards fuselage applications and ARALL generally directed towards wing applications. GLARE fiber-metal laminates are traditionally constructed by alternating layers of a fiber glass/epoxy prepreg (unidirectional or biaxial) with pre-treated aluminum foil (i.e., 0.2-0.4 mm thick 2024 T3 foil, etched using proprietary processes to enhance adhesion to the composite layers). These laminated structures can have wide applicability in aircraft structures due to their excellent fatigue performance, reduced corrosion rates, and slow crack propagation characteristics in the presence of stress risers (e.g., holes, rivets, edges). Such laminates are typically molded in an autoclave or press under heat and pressure. An example of a GLARE fiber-metal laminate can incorporate 3 layers of aluminum and 2 layers of biaxial composite and is sometimes referred to as a GLARE 3/2 laminates. Embodiments may also exist that incorporate 4 layers of aluminum and 3 layers of composite, or 5 layers of aluminum and 4 layers of composite.

Prepregs of the present invention can be substituted into such GLARE and ARALL fiber-metal laminates (or other fiber-metal laminates) as a replacement for current fiber glass prepregs used in such products. Accordingly, a fiber-metal laminate can comprise a prepreg according to some embodiments of the present invention, a first metal sheet adhesively secured to one surface of the prepreg, and a second metal sheet adhesively secured to a second surface of the prepreg, such that the prepreg is positioned between the two metal sheets. In some embodiments, multiple layers of prepregs can be incorporated in, for example, a 3/2 arrangement (two prepreg layers between three metal sheets in a metal/prepreg/metal/prepreg/metal arrangement), a 4/3 arrangement (three prepreg layers between four metal sheets in a metal/prepreg/metal/prepreg/metal/prepreg/metal arrangement), a 5/4 arrangement (four prepreg layers between five metal sheets in a metal/prepreg/metal/prepreg/metal/prepreg/metal/prepreg/metal arrangement), or other arrangements. In some embodiments, the metal sheets can comprise aluminum or other metals typically used in fiber-metal laminates. In some embodiments, the polymeric resin used in the prepreg comprises epoxy. In some embodiments, the prepreg is adhesively secured to the metal sheets using a film adhesive for a controlled bond line thickness as is known to those of skill in the art. In some embodiments, a separate adhesive is not require as the polymeric resin (e.g., an epoxy) used in the prepreg can adhere the prepreg to the metal sheets.

Some embodiments of the present invention relate to radomes. Radomes are radar enclosures or structural shells that are typically built using materials that provide a low dielectric constant to minimize signal reflections to/from the radar. High cost fibers such as quartz and aramid, as well as high strength fiber glass, have been used successfully in the production of radomes in combination with various resin systems. In addition to the radar transparency requirements, materials for radomes preferably provide high stiffness/strength as well as excellent durability characteristics to withstand environmental loads (wind, snow, rain, hail, fluctuating temperatures and UV degradation). Glass fibers according to some embodiments of the present invention can have a dielectric constant of 5.3@1 MHz which, although higher than quartz (~3.5), is lower than E-glass (6.3-6.6@1 MHz) and comparable to S-2 glass (5-5.4@1 MHz), making it a suitable glass fiber for use in radome applications.

In some embodiments, a radome of the present invention comprises a polymeric resin and a plurality of glass fibers disposed in the polymeric resin, wherein at least one of the plurality of glass fibers comprises a glass composition that comprises the following components: 60-68 weight percent $SiO_2$, 7-12 weight percent $B_2O_3$, 9-15 weight percent $Al_2O_3$, 8-15 weight percent MgO, 0-4 weight percent CaO, 0-2 weight percent $Li_2O$, 0-1 weight percent $Na_2O$, 0-1 weight percent $K_2O$, 0-1 weight percent $F_2O_3$, 0-1 weight percent $F_2$, 0-2 weight percent $TiO_2$, and 0-5 weight percent total other constituents. A radome of the present invention, in some embodiments, comprises a polymeric resin and a plurality of glass fibers disposed in the polymeric resin, wherein at least one of the plurality of glass fibers comprises a glass composition that comprises the following components: 53.5-77 weight percent $SiO_2$, 4.5-14.5 weight percent $B_2O_3$, 4.5-18.5 weight percent $Al_2O_3$, 4-12.5 weight percent MgO, 0-10.5 weight percent CaO, 0-4 weight percent $Li_2O$, 0-2 weight percent $Na_2O$, 0-1 weight percent $K_2O$, 0-1 weight percent $F_2O_3$, 0-2 weight percent $F_2$, 0-2 weight percent $TiO_2$, and 0-5 weight percent total other constituents. In other embodiments, a radome of the present invention can comprise a polymeric resin and a plurality of glass fibers disposed in the polymeric resin, wherein at least one of the plurality of glass fibers was formed from one of the other glass compositions disclosed herein as part of the present invention.

In some embodiments, a radome of the present invention comprises a radar enclosure or structural shell comprising a polymeric resin and at least one fiber glass strand as disclosed herein disposed in the polymeric resin. In some embodiments, a radome of the present invention comprises a polymeric resin and at least a portion of a roving comprising at least one fiber glass strand as disclosed herein disposed in the polymeric resin. In other embodiments, a radome of the present invention comprises a polymeric resin and at least one yarn as disclosed herein disposed in the polymeric resin. In still other embodiments, a radome of the present invention comprises a polymeric resin and at least one fabric as disclosed herein disposed in the polymeric resin. In some embodiments, a radome of the present invention comprises at least one fill yarn comprising at least one fiber glass strand as disclosed herein and at least one warp yarn comprising at least one fiber glass strand as disclosed herein.

Radomes of the present invention can comprise various polymeric resins, depending on the desired properties and applications. In some embodiments of the present invention related to radomes, the polymeric resin can comprise epoxy, phenolic, polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins.

Glass fibers useful in the present invention can be made by any suitable method known to one of ordinary skill in the art, such as but not limited to the method described above herein. Further, a primary sizing composition can be applied to the glass fibers using any suitable method known to one of ordinary skill in the art. In some embodiments, the sizing composition can be applied immediately after forming the glass fibers. The sizing composition can comprise any suitable sizing composition known to one of ordinary skill in the art for reinforcement applications. In some embodiments, the sizing composition does not comprise a starch-oil sizing composition. In some embodiments of the present invention comprising a sizing composition that does not comprise a starch-oil sizing composition, a sized glass fiber or glass fiber strand need not be further treated with a slashing composition prior to using the fiber or strand in weaving applications. In other embodiments comprising a sizing composition that does not comprise a starch-oil sizing composition, a sized glass fiber or glass fiber strand may optionally be further treated with a slashing composition prior to using the fiber or strand in weaving applications. In some embodiments of the present invention comprising a primary sizing composition, the sizing composition can comprise a starch-oil sizing composition. In some embodiments of the present invention comprising a starch-oil sizing composition, the starch-oil sizing composition may later be removed from a fabric formed from at least one sized glass fiber or fiber glass strand. In some embodiments, the starch-oil sizing may be removed from a fabric using any suitable method known to one of ordinary skill in the art, such as but not limited to heat cleaning. In embodiments of the present invention comprising fabrics from which a starch-oil sizing composition has been removed, a fabric of the present invention may further be treated with a finish coating.

Fiber glass strands of the present invention can be prepared by any suitable method known to one of ordinary skill in the art. Glass fiber fabrics of the present invention can generally be made by any suitable method known to one of ordinary skill in the art, such as but not limited to interweaving weft yarns (also referred to as "fill yarns") into a plurality of warp yarns. Such interweaving can be accomplished by positioning the warp yarns in a generally parallel, planar array on a loom, and thereafter weaving the weft yarns into the warp yarns by passing the weft yarns over and under the warp yarns in a predetermined repetitive pattern. The pattern used depends upon the desired fabric style.

Warp yarns can generally be prepared using techniques known to those of skill in the art. Warp yarns can be formed by attenuating a plurality of molten glass streams from a bushing or spinner. Thereafter, a sizing composition can be applied to the individual glass fibers and the fibers can be gathered together to form a strand. The strands can be subsequently processed into yarns by transferring the strands to a bobbin via a twist frame. During this transfer, the strands can be given a twist to aid in holding the bundle of fibers together. These twisted strands can then be wound about the bobbin, and the bobbins can be used in the weaving processes.

Positioning of the warp yarns on the loom can generally be done using techniques known to those of ordinary skill in the art. Positioning of the warp yarns on the loom can be done by way of a loom beam. A loom beam comprises a specified number of warp yarns (also referred to as "ends") wound in an essentially parallel arrangement (also referred to as "warp sheet") about a cylindrical core. Loom beam preparation can comprise combining multiple yarn packages, each package comprising a fraction of the number of ends required for the loom beam, into a single package or loom beam. For example and although not limiting herein, a 50 inch (127 cm) wide, a 7781 style fabric which utilizes a DE75 yarn input typically requires 2868 ends. However, conventional equipment for forming a loom beam does not allow for all of these ends to be transferred from bobbins to a single beam in one operation. Therefore, multiple beams comprising a fraction of the number of required ends, typically referred to as "section beams," can be produced and thereafter combined to form the loom beam. In a manner similar to a loom beam, a section beam can include a cylindrical core comprising a plurality of essentially parallel warp yarns wound thereabout. While it will be recognized by one skilled in the art that the section beam can comprise any number of warp yarns required to form the final loom beam, generally the number of ends contained on a section beam is limited by the capacity of the warping creel. For a 7781 style fabric, four section beams of 717 ends each of DE75 yarn are typically provided and when combined offer the required 2868 ends for the warp sheet, as discussed above.

Composites of the present invention can be prepared by any suitable method known to one of ordinary skill in the art, such as but not limited to vacuum assisted resin infusion molding, extrusion compounding, compression molding, resin transfer molding, filament winding, prepreg/autoclave curing, and pultrusion. Composites of the present invention can be prepared using such molding techniques as known to those of ordinary skill in the art. In particular, embodiments of composites of the present invention that incorporate woven fiber glass fabrics can be prepared using techniques known to those of skill in the art for preparation of such composites.

As an example, some composites of the present invention can be made using vacuum assisted compression molding, which technique is well-known to those of skill in the art and described briefly below. As known to those of skill in the art, with vacuum assisted compression molding, a stack of pre-impregnated glass fabrics is placed within a press platen. In some embodiments of the present invention, the stack of pre-impregnated glass fabrics can include one or more fabrics of the present invention as described herein that have been cut to a desired size and shape. Upon completion of the stacking operation for the corresponding number of layers, the press is closed and the platens are connected to a vacuum pump so that the upper platen compresses on the stack of fabrics until the desired pressure is achieved. The vacuum aids in the evacuation of entrapped air within the stack and provides for a reduced void content in the molded laminate. Following connection of the platens to a vacuum pump, the temperature of the platens is then increased to accelerate the conversion rate of the resin (e.g., a thermosetting resin) to a predetermined temperature setting particular to the resin utilized, and kept at that temperature and pressure setting until the laminate reaches full cure. At this point, the heat is turned off and the platens are cooled by water circulation until they reach room temperature. The platens can then be opened, and the molded laminate can be removed from the press.

As another example, some composites of the present invention can be made using vacuum assisted resin infusion technology, as further described herein. A stack of glass fiber fabrics of the present invention may be cut to a desired size and placed on a silicone release treated glass table. The stack may then be covered with a peel ply, fitted with a flow enhancing media, and vacuum bagged using nylon bagging film. Next, the so-called "lay up" may be subjected to a vacuum pressure of about 27 inches Hg. Separately, the polymeric resin that is to be reinforced with the fiber glass fabrics can be prepared using techniques known to those of skill in the art for that particular resin. For example, for some polymeric resins, an appropriate resin (e.g., an amine-curable epoxy resin) may be mixed with an appropriate curing agent (e.g., an amine for an amine-curable epoxy resin) in the proportions recommended by the resin manufacturer or otherwise known to a person of ordinary skill in the art. The combined resin may then be degassed in a vacuum chamber for 30 minutes and infused through the fabric preform until substantially complete wet out of the fabric stack is achieved. At this point, the table may be covered with heated blankets (set to a temperature of about 45-50° C.) for 24 hours. The resulting rigid composites may then be de-molded and post cured at about 250° F. for 4 hours in a programmable convection oven. As is known to persons of ordinary skill in the art, however, various parameters such as degassing time, heating time, and post curing conditions may vary based on the specific resin system used, and persons of ordinary skill in the art understand how to select such parameters based on a particular resin system.

Laminates of the present invention can be prepared by any suitable means known to one of ordinary skill in the art, such as but not limited to infusion.

Prepregs of the present invention can be prepared by any suitable means known to one of ordinary skill in the art, such as but not limited to passing fiber glass strands, rovings, or fabrics through a resin bath; using a solvent-based resin; or using a resin film.

Fiber-metal laminates of the present invention can be prepared by any suitable means known to one of ordinary skill in the art using prepregs of the present invention.

Radomes of the present invention can be prepared by any suitable means known to one of ordinary skill in the art.

As noted above, some embodiments of the present invention can comprise a plurality of glass fibers. Glass fibers suitable for use in the present invention can have any appropriate diameter known to one of ordinary skill in the art, depending on the desired application. Glass fibers suitable for use in some embodiments of the present invention have a diameter of about 5 to about 13 μm. Glass fibers suitable for use in other embodiments of the present invention have a diameter of about 5-7 μm.

In addition, glass fibers and glass fiber strands suitable for use in the present invention can comprise a variety of glass compositions that also represent embodiments of the present invention. Some embodiments of such glass fibers and fiber glass strands are set forth above and others are described below. As noted above, one example of glass fiber or fiber glass strand suitable for use in some embodiments of the present invention comprises a glass composition comprising

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-4 weight percent; |
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total. |

Another example of a glass fiber or fiber glass strand suitable for use in some embodiments of the present invention comprises a glass composition comprising

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-4 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the $Li_2O$ content is greater than either the $Na_2O$ content or the $K_2O$ content. In other embodiments, the CaO content is 0-3 weight percent. In still other embodiments, the CaO content is 0-2 weight percent. In some embodiments, the CaO content is 0-1 weight percent. In some embodiments of the present invention, the MgO content is 8-13 weight percent. In other embodiments, the MgO content is 9-12 weight percent. In some embodiments, the $TiO_2$ content is 0-1 weight percent. In some embodiments, the $B_2O_3$ content is no more than 10 weight percent. In some embodiments of the present invention, the $Al_2O_3$ content is 9-14 weight percent. In other embodiments, the $Al_2O_3$ content is 10-13 weight percent. In some embodiments, the ($Li_2O+Na_2O+K_2O$) content is less than 2 weight percent. In some embodiments, the composition contains 0-1 weight percent of BaO and 0-2 weight percent ZnO. In other embodiments, the composition contains essentially no BaO and essentially no ZnO. In some embodiments, other constituents, if any, are present in a total amount of 0-2 weight percent. In other embodiments, other constituents, if any, are present in a total amount of 0-1 weight percent. In some embodiments, the $Li_2O$ content is 0.4-2.0 weight percent. In other embodiments comprising a $Li_2O$ content of 0.4-2.0 weight percent, the $Li_2O$ content is greater than the ($Na_2O+K_2O$) content.

Another example of a glass fiber or fiber glass strand suitable for use in some embodiments of the present invention comprises a glass composition comprising

| | |
|---|---|
| $SiO_2$ | 60-68 weight percent; |
| $B_2O_3$ | 7-13 weight percent; |
| $Al_2O_3$ | 9-15 weight percent; |
| MgO | 8-15 weight percent; |
| CaO | 0-4 weight percent; |

-continued

| | |
|---|---|
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; and |
| $TiO_2$ | 0-2 weight percent. |

In some embodiments, the glass compositions are characterized by relatively low content of CaO, for example on the order of about 0-4 weight percent. In yet other embodiments, the CaO content can be on the order of about 0-3 weight percent. In some embodiments, the MgO content is double that of the CaO content (on a weight percent basis). Some embodiments of the invention can have a MgO content greater than about 6.0 weight percent, and in other embodiments the MgO content can be greater than about 7.0 weight percent. Some glass compositions suitable for use in some embodiments of the present invention can be characterized by the presence of less than 1.0 weight percent BaO. In those embodiments in which only trace impurity amounts of BaO are present, the BaO content can be characterized as being no more than 0.05 weight percent.

Another example of a glass fiber or fiber glass strand suitable for use in some embodiments of the present invention comprises a glass composition comprising

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-4 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the $Li_2O$ content is greater than either the $Na_2O$ content or the $K_2O$ content, and wherein the constituents are selected to provide a glass having a dielectric constant ($D_k$) less than 6.7 at 1 MHz frequency. In other embodiments, the constituents are selected to provide a glass having a dielectric constant ($D_k$) less than 6 at 1 MHz frequency. In still other embodiments, the constituents are selected to provide a glass having a dielectric constant ($D_k$) less than 5.8 at 1 MHz frequency. In some embodiments, the constituents are selected to provide a glass having a dielectric constant ($D_k$) less than 5.6 at 1 MHz frequency.

The constituents of a glass composition suitable for use in some embodiments of the present invention can be selected based on a desired forming temperature (defined as the temperature at which the viscosity is 1000 poise) and/or a desired liquidus temperature. In some embodiments, a glass fiber or fiber glass strand suitable for use in the present invention comprises a glass composition comprising

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-4 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the $Li_2O$ content is greater than either the $Na_2O$ content or the $K_2O$ content, and wherein the constituents are selected to provide a forming temperature $T_F$ at 1000 poise viscosity no greater than 1370° C. In other embodiments, the constituents are selected to provide a forming temperature $T_F$ at 1000 poise viscosity no greater than 1320° C. In still other embodiments, the constituents are selected to provide a forming temperature $T_F$ at 1000 poise viscosity no greater than 1300° C. In some embodiments, the constituents are selected to provide a forming temperature $T_F$ at 1000 poise viscosity no greater than 1290° C. In some embodiments, the constituents are selected to provide a forming temperature $T_F$ at 1000 poise viscosity no greater than 1370° C. and a liquidus temperature $T_L$ at least 55° C. below the forming temperature. In other embodiments, the constituents are selected to provide a forming temperature $T_F$ at 1000 poise viscosity no greater than 1320° C. and a liquidus temperature $T_L$ at least 55° C. below the forming temperature. In still other embodiments, the constituents are selected to provide a forming temperature $T_F$ at 1000 poise viscosity no greater than 1300° C. and a liquidus temperature $T_L$ at least 55° C. below the forming temperature. In some embodiments, the constituents are selected to provide a forming temperature $T_F$ at 1000 poise viscosity no greater than 1290° C. and a liquidus temperature $T_L$ at least 55° C. below the forming temperature.

Another example of a glass fiber or fiber glass strand suitable for use in some embodiments of the present invention comprises a glass composition comprising

| | |
|---|---|
| $B_2O_3$ | less than 12 weight percent; |
| $Al_2O_3$ | 9-15 weight percent; |
| MgO | 8-15 weight percent; |
| CaO | 0-4 weight percent; |
| $SiO_2$ | 60-68 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; and |
| $TiO_2$ | 0-2 weight percent; | wherein the glass exhibits a dielectric constant ($D_k$) less than 6.7 and forming temperature ($T_F$) at 1000 poise viscosity no greater than 1370° C. and wherein the $Li_2O$ content is greater than either the $Na_2O$ content or the $K_2O$ content. In some embodiments, the CaO content is 0-1 weight percent.

Another example of a glass fiber or fiber glass strand suitable for use in some embodiments of the present invention comprises a glass composition comprising

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-3 weight percent; |
| $Li_2O$ | 0.4-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; and |
| $TiO_2$ | 0-2 weight percent; | wherein the glass exhibits a dielectric constant ($D_k$) less than 5.9 and forming temperature ($T_F$) at 1000 poise viscosity no greater than 1300° C. and wherein the $Li_2O$ content is greater than either the $Na_2O$ content or the $K_2O$ content.

Another example of a glass fiber or fiber glass strand suitable for use in some embodiments of the present invention comprises a glass composition consisting essentially of

| | | |
|---|---|---|
| $SiO_2$ | 60-68 | weight percent; |
| $B_2O_3$ | 7-11 | weight percent; |
| $Al_2O_3$ | 9-13 | weight percent; |
| MgO | 8-13 | weight percent; |
| CaO | 0-3 | weight percent; |
| $Li_2O$ | 0.4-2 | weight percent; |
| $Na_2O$ | 0-1 | weight percent; |
| $K_2O$ | 0-1 | weight percent; |
| ($Na_2O + K_2O + Li_2O$) | 0-2 | weight percent; |
| $Fe_2O_3$ | 0-1 | weight percent; |
| $F_2$ | 0-1 | weight percent; and |
| $TiO_2$ | 0-2 | weight percent; | wherein the $Li_2O$ content is greater than either the $Na_2O$ content or the $K_2O$ content. In some embodiments, the CaO content is 0-1 weight percent. In some embodiments comprising a CaO content of 0-1 weight percent, the $B_2O_3$ content is no more than 10 weight percent.

Another example of a glass fiber or fiber glass strand suitable for use in some embodiments of the present invention comprises a glass composition comprising

| | | |
|---|---|---|
| $SiO_2$ | 60-68 | weight percent; |
| $B_2O_3$ | 7-10 | weight percent; |
| $Al_2O_3$ | 9-15 | weight percent; |
| MgO | 8-15 | weight percent; |
| CaO | 0-4 | weight percent; |
| $Li_2O$ | >0-2 | weight percent; |
| $Na_2O$ | 0-1 | weight percent; |
| $K_2O$ | 0-1 | weight percent; |
| $Fe_2O_3$ | 0-1 | weight percent; |
| $F_2$ | 0-1 | weight percent; |
| $TiO_2$ | 0-2 | weight percent; and |
| other constituents | 0-5 | weight percent; | wherein the $Li_2O$ content is greater than either the $Na_2O$ content or the $K_2O$ content. In some embodiments, the constituents are selected to provide a glass having a dielectric constant ($D_k$) less than 6.7 at 1 MHz frequency. In other embodiments, the constituents are selected to provide a glass having a dielectric constant ($D_k$) less than 6 at 1 MHz frequency. In still other embodiments, the constituents are selected to provide a glass having a dielectric constant ($D_k$) less than 5.8 at 1 MHz frequency. In some embodiments, the constituents are selected to provide a glass having a dielectric constant ($D_k$) less than 5.6 at 1 MHz frequency.

Another example of a glass fiber or fiber glass strand suitable for use in some embodiments of the present invention comprises a glass composition comprising:

| | | |
|---|---|---|
| $SiO_2$ | 53.5-77 | weight percent; |
| $B_2O_3$ | 4.5-14.5 | weight percent; |
| $Al_2O_3$ | 4.5-18.5 | weight percent; |
| MgO | 4-12.5 | weight percent; |
| CaO | 0-10.5 | weight percent; |
| $Li_2O$ | 0-4 | weight percent; |
| $Na_2O$ | 0-2 | weight percent; |
| $K_2O$ | 0-1 | weight percent; |
| $Fe_2O_3$ | 0-1 | weight percent; |
| $F_2$ | 0-2 | weight percent; |
| $TiO_2$ | 0-2 | weight percent; and |
| other constituents | 0-5 | weight percent total. |

Another example of a glass fiber or fiber glass strand suitable for use in some embodiments of the present invention comprises a glass composition comprising:

| | | |
|---|---|---|
| $SiO_2$ | 60-77 | weight percent; |
| $B_2O_3$ | 4.5-14.5 | weight percent; |
| $Al_2O_3$ | 4.5-18.5 | weight percent; |
| MgO | 8-12.5 | weight percent; |
| CaO | 0-4 | weight percent; |
| $Li_2O$ | 0-3 | weight percent; |
| $Na_2O$ | 0-2 | weight percent; |
| $K_2O$ | 0-1 | weight percent; |
| $Fe_2O_3$ | 0-1 | weight percent; |
| $F_2$ | 0-2 | weight percent; |
| $TiO_2$ | 0-2 | weight percent; and |
| other constituents | 0-5 | weight percent total. |

Another example of a glass fiber or fiber glass strand suitable for use in some embodiments of the present invention comprises a glass composition comprising:

| | | |
|---|---|---|
| $SiO_2$ | at least 60 | weight percent; |
| $B_2O_3$ | 5-11 | weight percent; |
| $Al_2O_3$ | 5-18 | weight percent; |
| MgO | 5-12 | weight percent; |
| CaO | 0-10 | weight percent; |
| $Li_2O$ | 0-3 | weight percent; |
| $Na_2O$ | 0-2 | weight percent; |
| $K_2O$ | 0-1 | weight percent; |
| $Fe_2O_3$ | 0-1 | weight percent; |
| $F_2$ | 0-2 | weight percent; |
| $TiO_2$ | 0-2 | weight percent; and |
| other constituents | 0-5 | weight percent total. |

Another example of a glass fiber or fiber glass strand suitable for use in some embodiments of the present invention comprises a glass composition comprising:

| | | |
|---|---|---|
| $SiO_2$ | 60-68 | weight percent; |
| $B_2O_3$ | 5-10 | weight percent; |
| $Al_2O_3$ | 10-18 | weight percent; |
| MgO | 8-12 | weight percent; |
| CaO | 0-4 | weight percent; |
| $Li_2O$ | 0-3 | weight percent; |
| $Na_2O$ | 0-2 | weight percent; |
| $K_2O$ | 0-1 | weight percent; |
| $Fe_2O_3$ | 0-1 | weight percent; |
| $F_2$ | 0-2 | weight percent; |
| $TiO_2$ | 0-2 | weight percent; and |
| other constituents | 0-5 | weight percent total. |

Another example of a glass fiber or fiber glass strand suitable for use in some embodiments of the present invention comprises a glass composition comprising:

| | | |
|---|---|---|
| $SiO_2$ | 62-68 | weight percent; |
| $B_2O_3$ | 7-9 | weight percent; |
| $Al_2O_3$ | 11-18 | weight percent; |
| MgO | 8-11 | weight percent; |
| CaO | 1-2 | weight percent; |
| $Li_2O$ | 1-2 | weight percent; |
| $Na_2O$ | 0-0.5 | weight percent; |
| $K_2O$ | 0-0.5 | weight percent; |
| $Fe_2O_3$ | 0-0.5 | weight percent; |
| $F_2$ | 0.5-1 | weight percent; |
| $TiO_2$ | 0-1 | weight percent; and |
| other constituents | 0-5 | weight percent total. |

Another example of a glass fiber or fiber glass strand suitable for use in some embodiments of the present invention comprises a glass composition comprising:

| | |
|---|---|
| SiO$_2$ | 62-68 weight percent; |
| B$_2$O$_3$ | less than about 9 weight percent; |
| Al$_2$O$_3$ | 10-18 weight percent; |
| MgO | 8-12 weight percent; and |
| CaO | 0-4 weight percent; | wherein the glass exhibits a dielectric constant (D$_k$) less than 6.7 and a forming temperature (T$_F$) at 1000 poise viscosity no greater than 1370° C.

Another example of a glass fiber or fiber glass strand suitable for use in some embodiments of the present invention comprises a glass composition comprising:

| | |
|---|---|
| B$_2$O$_3$ | less than 14 weight percent; |
| Al$_2$O$_3$ | 9-15 weight percent; |
| MgO | 8-15 weight percent; |
| CaO | 0-4 weight percent; and |
| SiO$_2$ | 60-68 weight percent; | wherein the glass exhibits a dielectric constant (D$_k$) less than 6.7 and forming temperature (T$_F$) at 1000 poise viscosity no greater than 1370° C.

Another example of a glass fiber or fiber glass strand suitable for use in some embodiments of the present invention comprises a glass composition comprising:

| | |
|---|---|
| B$_2$O$_3$ | less than 9 weight percent; |
| Al$_2$O$_3$ | 11-18 weight percent; |
| MgO | 8-11 weight percent; |
| CaO | 1-2 weight percent; and |
| SiO$_2$ | 62-68 weight percent; | wherein the glass exhibits a dielectric constant (D$_k$) less than 6.7 and forming temperature (T$_F$) at 1000 poise viscosity no greater than 1370° C.

Another example of a glass fiber or fiber glass strand suitable for use in some embodiments of the present invention comprises a glass composition comprising:

| | |
|---|---|
| SiO$_2$ | 60-68 weight percent; |
| B$_2$O$_3$ | 7-13 weight percent; |
| Al$_2$O$_3$ | 9-15 weight percent; |
| MgO | 8-15 weight percent; |
| CaO | 0-3 weight percent; |
| Li$_2$O | 0.4-2 weight percent; |
| Na$_2$O | 0-1 weight percent; |
| K$_2$O | 0-1 weight percent; |
| Fe$_2$O$_3$ | 0-1 weight percent; |
| F$_2$ | 0-1 weight percent; and |
| TiO$_2$ | 0-2 weight percent; | wherein the glass exhibits a dielectric constant (D$_k$) less than 5.9 and forming temperature (T$_F$) at 1000 poise viscosity no greater than 1300° C.

Another example of a glass fiber or fiber glass strand suitable for use in some embodiments of the present invention comprises a glass composition comprising:

| | |
|---|---|
| SiO$_2$ | 60-68 weight percent; |
| B$_2$O$_3$ | 7-11 weight percent; |
| Al$_2$O$_3$ | 9-13 weight percent; |
| MgO | 8-13 weight percent; |
| CaO | 0-3 weight percent; |
| Li$_2$O | 0.4-2 weight percent; |
| Na$_2$O | 0-1 weight percent; |
| K$_2$O | 0-1 weight percent; |
| (Na$_2$O + K$_2$O + Li$_2$O) | 0-2 weight percent; |
| Fe$_2$O$_3$ | 0-1 weight percent; |
| F$_2$ | 0-1 weight percent; and |
| TiO$_2$ | 0-2 weight percent. |

In addition to or instead of the features of the invention described above, some embodiments of the glass compositions of the present invention can be utilized to provide glasses having dissipation factors (D$_f$) lower than standard electronic E-glass. In some embodiments, D$_f$ may be no more than 0.0150 at 1 GHz, and in other embodiments no more than 0.0100 at 1 GHz.

In some embodiments of glass compositions, D$_f$ is no more than 0.007 at 1 GHz, and in other embodiments no more than 0.003 at 1 GHz, and in yet other embodiments no more than 0.002 at 1 GHz.

In some embodiments, the glass compositions that can be used in glass fibers or fiber glass strands of the invention are characterized by relatively low content of CaO, for example, on the order of about 0-4 weight percent. In yet other embodiments, the CaO content can be on the order of about 0-3 weight percent. In yet other embodiments, the CaO content can be on the order of about 0-2 weight percent. In general, minimizing the CaO content yields improvements in electrical properties, and the CaO content has been reduced to such low levels in some embodiments that it can be considered an optional constituent. In some other embodiments, the CaO content can be on the order of about 1-2 weight percent.

On the other hand, the MgO content is relatively high for glasses of this type, wherein in some embodiments the MgO content is double that of the CaO content (on a weight percent basis). Some embodiments of the invention can have MgO content greater than about 5.0 weight percent, and in other embodiments the MgO content can be greater than 8.0 weight percent. In some embodiments, the compositions are characterized by a MgO content, for example, on the order of about 8-13 weight percent. In yet other embodiments, the MgO content can be on the order of about 9-12 weight percent. In some other embodiments, the MgO content can be on the order of about 8-12 weight percent. In yet some other embodiments, the MgO content can be on the order of about 8-10 weight percent.

In some embodiments, the compositions that can be used in glass fibers or fiber glass strands of the invention are characterized by a (MgO+CaO) content, for example, that is less than 16 weight percent. In yet other embodiments, the (MgO+CaO) content is less than 13 weight percent. In some other embodiments, the (MgO+CaO) content is 7-16 weight percent. In yet some other embodiments, the (MgO+CaO) content can be on the order of about 10-13 weight percent.

In yet some other embodiments, the compositions can be characterized by a ratio of (MgO+CaO)/(Li$_2$O+Na$_2$O+K$_2$O) content on the order of about 9.0. In certain embodiments, the ratio of Li$_2$O/(MgO+CaO) content can be on the order of about 0-2.0. In yet some other embodiments, the ratio of Li$_2$O/(MgO+CaO) content can be on the order of about 1-2.0. In certain embodiments, the ratio of Li$_2$O/(MgO+CaO) content can be on the order of about 1.0.

In some other embodiments, the (SiO$_2$+B$_2$O$_3$) content can be on the order of 70-76 weight percent. In yet other embodiments, the (SiO$_2$+B$_2$O$_3$) content can be on the order of 70 weight percent. In other embodiments, the (SiO$_2$+B$_2$O$_3$) content can be on the order of 73 weight percent. In still other embodiments, the ratio of the weight percent of Al$_2$O$_3$ to the weigh percent of B$_2$O$_3$ is on the order of 1-3. In some other embodiments, the ratio of the weight percent of $Al_2O_3$ to the weight percent of $B_2O_3$ is on the order of 1.5-2.5. In certain embodiments, the $SiO_2$ content is on the order of 65-68 weight percent.

As noted above, some low $D_k$ compositions of the prior art have the disadvantage of requiring the inclusion of substantial amounts of BaO, and it can be noted that BaO is not required in some embodiments of glass compositions of the present invention. Although the advantageous electrical and manufacturing properties of the invention do not preclude the presence of BaO, the absence of deliberate inclusions of BaO can be considered an additional advantage of some embodiments of the present invention. Thus, embodiments of the present invention can be characterized by the presence of less than 1.0 weight percent BaO. In those embodiments in which only trace impurity amounts are present, the BaO content can be characterized as being no more than 0.05 weight percent.

The compositions that can be used in glass fibers or fiber glass strands of the invention include $B_2O_3$ in amounts less that the prior art approaches that rely upon high $B_2O_3$ to achieve low $D_k$. This results in significant cost savings. In some embodiments the $B_2O_3$ content need be no more than 13 weight percent, or no more than 12 weight percent. Some embodiments of the invention also fall within the ASTM definition of electronic E-glass, i.e., no more than 10 weight percent $B_2O_3$.

In some embodiments, the compositions are characterized by a $B_2O_3$ content, for example, on the order of about 5-11 weight percent. In some embodiments, the $B_2O_3$ content can be 6-11 weight percent. The $B_2O_3$ content, in some embodiments, can be 6-9 weight percent. In some embodiments, the $B_2O_3$ content can be 5-10 weight percent. In some other embodiments, the $B_2O_3$ content is not greater than 9 weight percent. In yet some other embodiments, the $B_2O_3$ content is not greater than 8 weight percent.

In some embodiments, the compositions that can be used in glass fibers or fiber glass strands of the present invention are characterized by a $Al_2O_3$ content, for example on the order of about 5-18 weight percent. The $Al_2O_3$ content, in some embodiments, can be 9-18 weight percent. In yet other embodiments, the $Al_2O_3$ content is on the order of about 10-18 weight percent. In some other embodiments, the $Al_2O_3$ content is on the order of about 10-16 weight percent. In yet some other embodiments, the $Al_2O_3$ content is on the order of about 10-14 weight percent. In certain embodiments, the $Al_2O_3$ content is on the order of about 11-14 weight percent.

In some embodiments, $Li_2O$ is an optional constituent. In some embodiments, the compositions are characterized by a $Li_2O$ content, for example on the order of about 0.4-2.0 weight percent. In some embodiments, the $Li_2O$ content is greater than the $(Na_2O+K_2O)$ content. In some embodiments, the $(Li_2O+Na_2O+K_2O)$ content is not greater than 2 weight percent. In some embodiments, the $(Li_2O+Na_2O+K_2O)$ content is on the order of about 1-2 weight percent.

In certain embodiments, the compositions of the invention are characterized by a $TiO_2$ content for example on the order of about 0-1 weight percent.

In some embodiments of the compositions set forth above, the constituents are proportioned so as to yield a glass having a dielectric constant lower than that of standard E-glass. With reference to a standard electronic E-glass for comparison, this may be less than about 6.7 at 1 MHz frequency. In other embodiments, the dielectric constant $(D_k)$ may be less than 6 at 1 MHz frequency. In other embodiments, the dielectric constant $(D_k)$ may be less than 5.8 at 1 MHz frequency. Further embodiments exhibit dielectric constants $(D_k)$ less than 5.6 or even lower at 1 MHz frequency. In other embodiments, the dielectric constant $(D_k)$ may be less than 5.4 at 1 MHz frequency. In yet other embodiments, the dielectric constant $(D_k)$ may be less than 5.2 at 1 MHz frequency. In yet other embodiments, the dielectric constant $(D_k)$ may be less than 5.0 at 1 MHz frequency.

The compositions set forth above can also possess desirable temperature-viscosity relationships conducive to practical commercial manufacture of glass fibers. In general, lower temperatures are required for making fibers compared to the D-glass type of composition in the prior art. The desirable characteristics may be expressed in a number of ways, and they may be attained by some embodiments of compositions described herein singly or in combination. For example, certain glass compositions within the ranges set forth above can be made that exhibit forming temperatures $(T_F)$ at 1000 poise viscosity no greater than 1370° C. The $T_F$ of some embodiments are no greater than 1320° C., or no greater than 1300° C., or no greater than 1290° C., or no greater than 1260° C., or no greater than 1250° C. These compositions can also encompass glasses in which the difference between the forming temperature and the liquidus temperature $(T_L)$ is positive, and in some embodiments the forming temperature is at least 55° C. greater than the liquidus temperature, which is advantageous for commercial manufacturing of fibers from these glass compositions.

In general, minimizing alkali oxide content of the glass compositions used to form the glass fibers or fiber glass strands can assist in lowering $D_k$. In those embodiments in which it is desired to optimize reduction of $D_k$ the total alkali oxide content may be no more than 2 weight percent of the glass composition. In some embodiments, it has been found that minimizing $Na_2O$ and $K_2O$ are more effective in this regard than $Li_2O$. The presence of alkali oxides generally results in lower forming temperatures. Therefore, in those embodiments of the invention in which providing relatively low forming temperatures is a priority, $Li_2O$ is included in significant amounts, e.g. at least 0.4 weight percent. For this purpose, in some embodiments the $Li_2O$ content is greater than either the $Na_2O$ or $K_2O$ contents, and in other embodiments the $Li_2O$ content is greater than the sum of the $Na_2O$ and $K_2O$ contents, in some embodiments greater by a factor of two or more.

One advantageous aspect in some of the embodiments is reliance upon constituents that are conventional in the fiber glass industry and avoidance of substantial amounts of constituents whose raw material sources are costly. For this aspect, constituents in addition to those explicitly set forth in the compositional definition of the glasses of the present invention may be included even though not required, but in total amounts no greater than 5 weight percent. These optional constituents include melting aids, fining aids, colorants, trace impurities and other additives known to those of skill in glassmaking Relative to some prior art low $D_k$ glasses, no BaO is required in the compositions of the present invention, but inclusion of minor amounts of BaO (e.g., up to about 1 weight percent) would not be precluded. Likewise, major amounts of ZnO are not required in the present invention, but in some embodiments minor amounts (e.g., up to about 2.0 weight percent) may be included. In those embodiments of the invention in which optional constituents are minimized, the total of optional constituents is no more than 2 weight percent, or no more than 1 weight percent. Alternatively, some embodiments of the invention can be said to consist essentially of the named constituents.

The choice of batch ingredients and their cost are significantly dependent upon their purity requirements. Typical commercial ingredients, such as for E-glass making, contain impurities of $Na_2O$, $K_2O$, $Fe_2O_3$ or FeO, SrO, $F_2$, $TiO_2$, $SO_3$, etc. in various chemical forms. A majority of the cations from these impurities would increase the $D_k$ of the glasses by forming nonbridging oxygens with $SiO_2$ and/or $B_2O_3$ in the glass.

Sulfate (expressed as $SO_3$) may also be present as a refining agent. Small amounts of impurities may also be present from raw materials or from contamination during the melting processes, such as SrO, BaO, $Cl_2$, $P_2O_5$, $Cr_2O_3$, or NiO (not limited to these particular chemical forms). Other refining agents and/or processing aids may also be present such as $As_2O_3$, MnO, $MnO_2$, $Sb_2O_3$, or $SnO_2$, (not limited to these particular chemical forms). These impurities and refining agents, when present, are each typically present in amounts less than 0.5% by weight of the total glass composition. Optionally, elements from rare earth group of the Periodic Table of the Elements may be added to compositions of the present invention, including atomic numbers 21 (Sc), 39 (Y), and 57 (La) through 71 (Lu). These may serve as either processing aids or to improve the electrical, physical (thermal and optical), mechanical, and chemical properties of the glasses. The rare earth additives may be included with regard for the original chemical forms and oxidization states. Adding rare earth elements is considered optional, particularly in those embodiments of the present invention having the objective of minimizing raw material cost, because they would increase batch costs even at low concentrations. In any case, their costs would typically dictate that the rare earth components (measured as oxides), when included, be present in amounts no greater than about 0.1-1.0% by weight of the total glass composition.

Glass fibers, fiber glass strands, and other products incorporating such fibers or strands can exhibit desirable mechanical properties in some embodiments of the present invention, particularly as compared to E-glass fibers, fiber glass strands formed from E-glass, and related products. For example, some embodiments of glass fibers of the present invention can have relatively high specific strength or relatively high specific modulus, particularly, when compared to E-glass fibers. Specific strength refers to the tensile strength in $N/m^2$ divided by the specific weight in $N/m^3$. Specific modulus refers to the Young's modulus in $N/m^2$ divided by the specific weight in $N/m^3$. Glass fibers having relatively high specific strength and/or relatively high specific modulus may be desirable in applications where there is a desire to increase mechanical properties or product performance while reducing the overall weight of the composite. Examples of such composites are set forth above and include, for example, aerospace or aviation applications (e.g., interior floors of planes), wind energy applications (e.g., windmill blades), fiber-metal laminate applications, and others. As another example of a mechanical property, some embodiments of fiber glass strands of the present invention in the form of rovings can exhibit increased tensile strengths (e.g., on the order of 400-430 ksi in some embodiments per ASTM D2343) as compared to rovings incorporating E-glass fiber glass strands (e.g., on the order of 350-400 ksi per ASTM D2343).

As is known in the art, after formation, glass fibers are typically at least partially coated with a sizing composition. In general, glass fibers used to form fiber glass strands, fabrics, composites, laminates, and prepregs of the present invention will be at least partially coated with a sizing composition. One skilled in the art may choose one of many commercially available sizing compositions for the glass fibers based upon a number of factors including, for example, performance properties of the sizing compositions, desired flexibility of the resulting fabric, cost, and other factors. Non-limiting examples of commercially available sizing compositions that can be used in some embodiments of the present invention include sizing compositions often used on single-end rovings, such as Hybon 2026, Hybon 2002, Hybon 1383, Hybon 2006, Hybon 2022, Hybon 2032, Hybon 2016, and Hybon 1062, as well as sizing compositions often used on yarns, such as 1383, 611, 900, 610, 695, and 690, each of which refer to sizing compositions for products commercially available from PPG Industries, Inc.

As noted above, some embodiments of the present invention can comprise a fabric. Any suitable fabric design known to one of ordinary skill in the art for reinforcement applications can be used. Suitable fabrics can include fabrics produced using standard textile equipment (e.g., rapier, projectile, or air jet looms). Non-limiting examples of such fabrics include plain weaves, twill, crowfoot, and satin weaves. Stitch bonded or non-crimp fabrics can also be used in some embodiments of the present invention. Such fabrics can include, for example, unidirectional, biaxial and triaxial non-crimp fabrics. In addition, 3D woven fabrics can also be used in some embodiments of the present invention. Such fabrics can be produced using multi-layer warp ends with shedding, either with the use of a dobby or a jacquard head.

As noted above, composites of the present invention can comprise warp and weft yarns. Any suitable warp and weft yarns known to one of ordinary skill in the art for reinforcement applications may be used. In some embodiments, for example, warp yarns can comprise G75 yarn, DE75 yarn, DE150 yarn, and/or G150 yarn.

As noted above, composites of the present invention can comprise a polymeric resin, in some embodiments. A variety of polymeric resins can be used. Polymeric resins that are known to be useful in reinforcement applications can be particularly useful in some embodiments. In some embodiments, the polymeric resin can comprise a thermoset resin. Thermoset resin systems useful in some embodiments of the present invention can include but are not limited to epoxy resin systems, phenolic based resins, polyesters, vinyl esters, thermoset polyurethanes, polydicyclopentadiene (pDCPD) resins, cyanate esters, and bis-maleimides. In some embodiments, the polymeric resin can comprise an epoxy resin. In other embodiments, the polymeric resin can comprise a thermoplastic resin. Thermoplastic polymers useful in some embodiments of the present invention include but are not limited to polyethylene, polypropylene, polyamides (including Nylon), polybutylene terephthalate, polycarbonate, thermoplastic polyurethanes (TPU), polyphenylene sulfides, and polyether ether keteone (PEEK). Non-limiting examples of commercially available polymeric resins useful in some embodiments of the present invention include EPIKOTE Resin MGS® RIMR 135 epoxy with Epikure MGS RIMH 1366 curing agent (available from Momentive Specialty Chemicals Inc. of Columbus, Ohio), Applied Poleramic MMFCS2 epoxy (available from Applied Poleramic, Inc., Benicia, Calif.), and EP255 modified epoxy (available from Barrday Composite Solutions, Millbury, Mass.).

EXAMPLES

Some exemplary embodiments of the present invention will now be illustrated in the following specific, non-limiting examples.

Example 1

Some properties of a glass composition useful in some embodiments of the present invention were measured under controlled processing conditions using conventional testing methods known to those of ordinary skill in the art. Some measured properties are listed in Table 1. Properties of standard E-glass and commercial NE-glass are included for reference. The properties listed for commercial NE-glass come from the literature. The data in Table 1 indicate that glass fibers suitable for use in the present invention exhibit improved thermal, chemical, and mechanical stability compared to E-glass. Compared to NE-fibers, glass fibers suitable for use in the present invention are 30% stronger and 25% stiffer. As measured by x-ray fluorescence spectroscopy, the glass fibers of Sample 1 in Table 1 comprised a glass composition comprising

| | | |
|---|---|---|
| $SiO_2$ | 63.02 ± 0.25 | weight percent; |
| $B_2O_3$ | 9.39 ± 0.15 | weight percent; |
| $Al_2O_3$ | 11.60 ± 0.10 | weight percent; |
| MgO | 11.06 ± 0.15 | weight percent; |
| CaO | 2.54 ± 0.10 | weight percent; |
| $Na_2O$ | 0.38 ± 0.02 | weight percent; |
| $K_2O$ | 0.12 ± 0.01 | weight percent; |
| $Fe_2O_3$ | 0.25 ± 0.05 | weight percent; |
| $F_2$ | 0.72 ± 0.15 | weight percent; |
| $TiO_2$ | 0.10 ± 0.01 | weight percent; |
| $Li_2O$ | 0.81 ± 0.05; | and |
| $SO_3$ | 0.02 | weight percent. |

Example 2

In this Example, the yarn break load of a yarn formed from a fiber glass strand of the present invention ("the Sample Yarn") was compared to a yarn made from a fiber glass strand formed from a conventional 621 glass composition ("the 621 Yarn"). Each of the Yarns was formed from a single fiber glass strand having approximately 200 filaments with a nominal diameter of 7 microns. After forming, the glass fibers were coated with a conventional starch-oil sizing compositions. The fiber glass strands were dried and then twisted 1 turns per inch in the z direction to form the Yarns which were then woven into a plain weave style fabric with 60 picks per inch in the warp direction and 58 picks per inch in the weft direction.

The break loads of the fabrics were then measured using ASTM 5053. A one inch wide, 6 inch long strip of fabric was fitted with paper tabs and loaded at a speed of 12 inches per minute on a universal test frame until failure. A total of 12 break load measurements were taken per fabric. The average break load for the fabric strips made from the Sample Yarns was 197.5 $lb_f$, and the average break load for the fabric strips made from the 621 Yarns was 181.7 $lb_f$. The fabrics were then heat cleaned and finished using the same conventional technique. Following heat cleaning and finishing the break loads of the fabric strips were again measured using ASTM 5035. A

TABLE 1

Comparison of properties of a glass composition suitable for use in some embodiments of the present invention with properties of other glass compositions.

| Glasses: | | Sample 1 | E-Glass | NE-Glass | Sample 1 Relative to E-Glass |
|---|---|---|---|---|---|
| Fiber Density (g/cm³) | | 2.41 | 2.59 | 2.30 | 7% lighter |
| Filament Tensile Strength (MPa) | | 3660 | 3010 | 2800 | 22% stronger |
| Young's Modulus (GPa) | | 72 | 73 | 57 | same |
| Failure Strain (%) | | 5.08 | — | 4.90 | — |
| Linear Coefficient of Thermal Expansion (LCTE) from 25-300° C. ($10^{-6}$/° C.) | | 4.19 | 6.06 | 3.40 | 30% lower |
| Softening Point (° C.) | | 944 | 865 | — | 9% higher |
| Acid Resistance at 100° C. for 1 hr (% wt loss) | pH = 0: 1N $H_2SO_4$ | 0.79 | 1.02 | — | 23% better |
| | pH = 2: 0.1N $H_2SO_4$ | <0.01 | 0.19 | — | 90% better |
| Refractive Index (bulk/fiber) | | 1.518/ 1.510 | 1.563/ 1.554 | — | 3% lower |
| Dielectric Constant at 10 GHz ($D_k$) | | 5.27 | — | 4.70 | — |
| Dissipation Factor at 10 GHz ($D_f$) | | 0.006 | — | 0.004 | — |
| Dielectric Breakdown (kV) | | >50 (0.5 mm) | — | >50 (unknown) | — |
| Electrical Strength (V/mil) | | >2450 | — | 1000 | — |
| Volume Resistivity (ohm-cm) | | $1.0 \times 10^{13}$ | — | $1.0 \times 10^{15}$ | — | total of 12 break load measurements were taken. The average break load for the Sample fabric was 119.5 lb$_f$, and the average break load for the 621 fabric was 85.1 lb$_f$. The break load retention (break load after heat cleaning/finishing divided by break load prior to heat cleaning finishing×100) for the 621 fabric was 46.8%. The break load retention (break load after heat cleaning/finishing divided by break load prior to heat cleaning finishing) for the Sample fabric was 60.5%, demonstrating an improvement in break load over the 621 fabric.

Example 3

The tensile and impact properties of laminates of the present invention were compared to those of laminates made from glass fibers comprising conventional glass compositions. In this Example, a fabric was woven using warp and fill yarns made from fiber glass strands having glass compositions of the present invention ("the Sample Fabric"). The comparative fabric was formed from standard E-glass yarns ("E-glass Fabric"). Additional details about the fabrics are provided in Table 2:

TABLE 2

|  | Sample Fabric | E-Glass Fabric |
| --- | --- | --- |
| Fabric Style | 7781 | 7781 |
| Finish | 1383 | 497-A |
| Weave Pattern | 8 HS | 8HS |
| Warp Yarn Size | DE79 | DE75 |
| Fill Yarn Size | DE79 | DE75 |
| Count | 57 × 61 | 57 × 54 |
| Basis Weight | 8.68 oz/yd$^2$ | 8.73 oz/yd$^2$ |
| Thickness | 0.008" | 0.009" |
| Roll Length | 60 yds | 100 yds |

The pre-impregnated fabrics were then incorporated into laminates using vacuum assisted compression molding. The polymeric resin used was EP255 modified epoxy resin from Barrday Composite Solutions, Millbury, Mass. Ten fabric layers were incorporated into each of the laminates. The process conditions in Table 3 were used for the vacuum assisted compression molding setup:

TABLE 3

| Mold Temperature | 255° F. |
| --- | --- |
| Mold Time | 90 minutes |
| Mold Pressure | 70 psi |

Adequate cure of the resin was verified through determination of the glass transition temperature ($T_g$) for the composites (115.03° C. for the Sample Laminate and 116.57° C. for the E-glass Laminate). The fiber weight fraction of the Sample Laminate was 65.72% glass, and the fiber weight fraction for the E-glass Laminate was 67.39% glass.

Tensile properties of the laminates were measured according to ISO 527-4. Five Sample Laminates and five E-glass laminates were analyzed. Initial evaluation of the data suggested a slight increase in average tensile strain to failure for the Sample Laminates with respect to the E-glass Laminates (2.15% vs. 1.95%). There were also indications of slightly higher tensile strength and lower tensile modulus for Sample Laminates. However, these trends could not be deemed statistically significant after analysis of variance (ANOVA) was performed.

The impact properties of the laminates were also measured according to ASTM 3763 on specimens of equivalent thickness using a ⅜" hemispherical impactor and an instrumented impact testing machine. The impact properties of the Sample Laminate and the E-glass laminate were observed to be significantly different. In all cases, the Sample Laminates resulted in significantly increased impact performance evidenced by high energy at maximum load, and total energy absorbed by the samples. The average energy to maximum load was 30.984 Joules for the Sample Laminates and 14.204 Joules for the E-glass Laminates. The average total energy absorbed was 35.34 Joules for the Sample Laminates and 26.76 Joules for the E-glass Laminates. Thus, the Sample Laminates absorbed on average 32% more energy than the E-glass Laminates when subjected to the same impact velocity. Furthermore, the Sample Laminates exhibited far less damage than the E-glass Laminates and did not reach penetration.

Example 4

The glasses in this Example were made by melting mixtures of reagent grade chemicals in powder form in 10% Rh/Pt crucibles at the temperatures between 1500° C. and 1550° C. (2732° F.-2822° F.) for four hours. Each batch was about 1200 grams. After the 4-hour melting period, the molten glass was poured onto a steel plate for quenching. To compensate volatility loss of $B_2O_3$ (typically about 5% of the total target $B_2O_3$ concentration in laboratory batch melting condition for the 1200 gram batch size), the boron retention factor in the batch calculation was set at 95%. Other volatile species, such as fluoride and alkali oxides, were not adjusted in the batches for their emission loss because of their low concentrations in the glasses. The compositions in the examples represent as-batched compositions. Since reagent chemicals were used in preparing the glasses with an adequate adjustment of $B_2O_3$, the as-batched compositions illustrated are considered to be close to the measured compositions.

Melt viscosity as a function of temperature and liquidus temperature were determined by using ASTM Test Method C965 "Standard Practice for Measuring Viscosity of Glass Above the Softening Point," and C829 "Standard Practices for Measurement of Liquidus Temperature of Glass by the Gradient Furnace Method," respectively.

A polished disk of each glass sample with 40 mm diameter and 1-1.5 mm thickness was used for electrical property and mechanical property measurements, which were made from annealed glasses. Dielectric constant ($D_k$) and dissipation factor ($D_f$) of each glass were determined from 1 MHz to 1 GHz by ASTM Test Method D150 "Standard Test Methods for A-C Loss Characteristics and Permittivity (Dielectric Constant) of Solid Electrical Insulating Materials." According to the procedure, all samples were preconditioned at 25° C. under 50% humidity for 40 hours. Selective tests were performed for glass density using ASTM Test Method C729

"Standard Test Method for Density of Glass by the Sink-Float Comparator," for which all samples were annealed.

For selected compositions, a microindentation method was used to determine Young's modulus (from the initial slope of the curve of indentation loading—indentation depth, in the indenter unloading cycle), and microhardness (from the maximum indentation load and the maximum indentation depth). For the tests, the same disk samples, which had been tested for $D_k$ and $D_f$, were used. Five indentation measurements were made to obtain average Young's modulus and microhardness data. The microindentation apparatus was calibrated using a commercial standard reference glass block with a product name BK7. The reference glass has Young's modulus 90.1 GPa with one standard deviation of 0.26 GPa and microhardness 4.1 GPa with one standard deviation of 0.02 GPa, all of which were based on five measurements.

All compositional values in the examples are expressed in weight percent. In the Tables below, "E" refers to Young's modulus; "H" refers to microhardness; $\sigma_f$ refers to filament strength; and "Std" refers to standard deviation.

Table 4 Compositions

Samples 1-8 provide glass compositions (Table 4) by weight percentage: $SiO_2$ 62.5-67.5%, $B_2O_3$ 8.4-9.4%, $Al_2O_3$ 10.3-16.0%, MgO 6.5-11.1%, CaO 1.5-5.2%, $Li_2O$ 1.0%, $Na_2O$ 0.0%, $K_2O$ 0.8%, $Fe_2O_3$ 0.2-0.8%, $F_2$ 0.0%, $TiO_2$ 0.0%, and sulfate (expressed as $SO_3$) 0.0%.

The glasses were found to have $D_k$ of 5.44-5.67 and Df of 0.0006-0.0031 at 1 MHz, and $D_k$ of 5.47-6.67 and $D_f$ of 0.0048-0.0077 at 1 GHz frequency. The electric properties of the compositions in Series III illustrate significantly lower (i.e., improved) $D_k$ and $D_f$ over standard E-glass with $D_k$ of 7.29 and $D_f$ of 0.003 at 1 MHz and $D_k$ of 7.14 and $D_f$ of 0.0168 at 1 GHz.

In terms of fiber forming properties, the compositions in Table 4 have forming temperatures ($T_F$) of 1300-1372° C. and forming windows ($T_F$-$T_L$) of 89-222° C. This can be compared to a standard E-glass which has $T_F$ typically in the range 1170-1215° C. To prevent glass devitrification in fiber forming, a forming window ($T_F$-$T_L$) greater than 55° C. is desirable. All of the compositions in Table 4 exhibit satisfactory forming windows. Although the compositions of Table 4 have higher forming temperatures than E-glass, they have significantly lower forming temperatures than D-glass (typically about 1410° C.).

Table 5 Compositions

Samples 9-15 provide glass compositions: $SiO_2$ 60.8-68.0%, $B_2O_3$ 8.6 and 11.0%, $Al_2O_3$ 8.7-12.2%, MgO 9.5-12.5%, CaO 1.0-3.0%, $Li_2O$ 0.5-1.5%, $Na_2O$ 0.5%, $K_2O$ 0.8%, $Fe_2O_3$ 0.4%, $F_2$ 0.3%, $TiO_2$ 0.2%, and sulfate (expressed as $SO_3$) 0.0%.

The glasses were found to have $D_k$ of 5.55-5.95 and $D_f$ of 0.0002-0.0013 at 1 MHz, and $D_k$ of 5.54-5.94 and $D_f$ of 0.0040-0.0058 at 1 GHz frequency. The electric properties of the compositions in Table 5 illustrate significantly lower (improved) $D_k$ and $D_f$ over standard E-glass with $D_k$ of 7.29 and $D_f$ of 0.003 at 1 MHz, and $D_k$ of 7.14 and $D_f$ of 0.0168 at 1 GHz.

In terms of mechanical properties, the compositions of Table 5 have Young's modulus of 86.5-91.5 GPa and microhardness of 4.0-4.2 GPa, both of which are equal or higher than standard E glass that has Young's modulus of 85.9 GPa and microhardness of 3.8 GPa. The Young's moduli of the compositions in the Table 5 are also significantly higher than D-glass which is about 55 GPa based on literature data.

In terms of fiber forming properties, the compositions of Table 5 have forming temperature ($T_F$) of 1224-1365° C., and forming windows ($T_F$-$T_L$) of 6-105° C. as compared to standard E-glass having $T_F$ in the range 1170-1215° C. Some, but not all, of the Table 5 compositions have a forming window ($T_F$-$T_L$) greater than 55° C., which is considered preferable in some circumstances to avoid glass devitrification in commercial fiber forming operations. The Table 5 compositions have lower forming temperatures than those of D-glass (1410° C.), although higher than E-glass.

TABLE 4

Some glass compositions useful in some embodiments of the present invention.

| SAMPLES: | 1 | 2 | 3 | 4 | 5 | 6 | 7 | 8 |
|---|---|---|---|---|---|---|---|---|
| $Al_2O_3$ | 11.02 | 9.45 | 11.64 | 12.71 | 15.95 | 10.38 | 10.37 | 11.21 |
| $B_2O_3$ | 8.55 | 8.64 | 8.58 | 8.56 | 8.46 | 8.71 | 9.87 | 9.28 |
| CaO | 5.10 | 5.15 | 3.27 | 2.48 | 1.50 | 2.95 | 2.01 | 1.54 |
| CoO | 0.00 | 0.00 | 0.00 | 0.00 | 0.00 | 0.00 | 0.00 | 0.62 |
| $Fe_2O_3$ | 0.39 | 0.40 | 0.39 | 0.39 | 0.39 | 0.53 | 0.80 | 0.27 |
| $K_2O$ | 0.77 | 0.78 | 0.77 | 0.77 | 0.76 | 0.79 | 0.79 | 0.78 |
| $Li_2O$ | 0.98 | 0.99 | 0.98 | 0.98 | 0.97 | 1.00 | 1.00 | 1.00 |
| MgO | 6.70 | 7.44 | 8.04 | 8.69 | 9.24 | 10.39 | 11.05 | 11.04 |
| $SiO_2$ | 66.48 | 67.16 | 66.32 | 65.42 | 62.72 | 65.26 | 64.12 | 64.26 |
| Properties | | | | | | | | |
| $D_k$, 1 MHz | 5.62 | 5.59 | 5.44 | 5.47 | 5.50 | 5.67 | 5.57 | 5.50 |
| $D_k$, 1 GHz | 5.65 | 5.62 | 5.46 | 5.47 | 5.53 | 5.67 | 5.56 | 5.52 |
| $D_f$, 1 MHz | 0.0010 | 0.0006 | 0.0016 | 0.0008 | 0.0020 | 0.0031 | 0.0012 | 0.0010 |
| $D_f$, 1 GHz | 0.0048 | 0.0059 | 0.0055 | 0.0051 | 0.0077 | 0.0051 | 0.0053 | 0.0049 |
| $T_L$ (° C.) | 1209 | 1228 | 1215 | 1180 | 1143 | 1219 | 1211 | 1213 |
| $T_F$ (° C.) | 1370 | 1353 | 1360 | 1372 | 1365 | 1319 | 1300 | 1316 |
| $T_F$ – $T_L$ (° C.) | 161 | 125 | 145 | 192 | 222 | 100 | 89 | 103 |

TABLE 5

Some glass compositions useful in some embodiments of the present invention.

| SAMPLES: | 9 | 10 | 11 | 12 | 13 | 14 | 15 |
|---|---|---|---|---|---|---|---|
| $Al_2O_3$ | 12.02 | 11.88 | 10.41 | 12.08 | 12.18 | 8.76 | 12.04 |
| $B_2O_3$ | 10.98 | 10.86 | 9.90 | 8.71 | 8.79 | 8.79 | 8.68 |
| CaO | 1.07 | 2.90 | 2.02 | 2.95 | 1.09 | 1.09 | 2.94 |
| $F_2$ | 0.32 | 0.31 | 0.32 | 0.32 | 0.32 | 0.32 | 0.32 |
| $Fe_2O_3$ | 0.40 | 0.39 | 0.40 | 0.40 | 0.40 | 0.40 | 0.40 |
| $K_2O$ | 0.78 | 0.77 | 0.79 | 0.79 | 0.79 | 0.79 | 0.78 |
| $Li_2O$ | 0.50 | 0.49 | 1.00 | 0.50 | 1.51 | 1.51 | 1.49 |
| MgO | 12.35 | 9.56 | 11.10 | 12.41 | 12.51 | 9.81 | 9.69 |
| $Na_2O$ | 0.51 | 0.51 | 0.52 | 0.52 | 0.52 | 0.52 | 0.52 |
| $SiO_2$ | 60.87 | 62.13 | 63.35 | 61.14 | 61.68 | 67.80 | 62.95 |
| $TiO_2$ | 0.20 | 0.20 | 0.20 | 0.20 | 0.20 | 0.20 | 0.20 |
| Properties | | | | | | | |
| $D_k$, 1 MHz | 5.69 | 5.55 | 5.74 | 5.84 | 5.95 | 5.60 | 5.88 |
| $D_k$, 1 GHz | 5.65 | 5.54 | 5.71 | 5.83 | 5.94 | 5.55 | 5.86 |
| $D_f$, 1 MHz | 0.0007 | 0.0013 | 0.0007 | 0.0006 | 0.0002 | 0.0002 | 0.0011 |
| $D_f$, 1 GHz | 0.0042 | 0.0040 | 0.0058 | 0.0043 | 0.0048 | 0.0045 | 0.0053 |
| $T_L$ (° C.) | 1214 | 1209 | 1232 | 1246 | 1248 | 1263 | 1215 |
| $T_F$ (° C.) | 1288 | 1314 | 1287 | 1277 | 1254 | 1365 | 1285 |
| $T_F - T_L$ (° C.) | 74 | 105 | 55 | 31 | 6 | 102 | 70 |
| E (GPa) | 90.5 | 87.4 | 86.8 | 86.5 | 89.6 | 87.2 | 91.5 |
| H (GPa) | 4.12 | 4.02 | 4.02 | 4.03 | 4.14 | 4.07 | 4.19 |

TABLE 6

Some glass compositions useful in some embodiments of the present invention.

| SAMPLES: | 16 | 17 | 18 | 19 | 20 |
|---|---|---|---|---|---|
| $Al_2O_3$ | 10.37 | 11.58 | 8.41 | 11.58 | 12.05 |
| $B_2O_3$ | 8.71 | 10.93 | 10.66 | 8.98 | 8.69 |
| CaO | 2.01 | 2.63 | 3.02 | 1.78 | 2.12 |
| $F_2$ | 0.32 | 0.30 | 0.30 | 0.30 | 0.30 |
| $Fe_2O_3$ | 0.40 | 0.27 | 0.27 | 0.27 | 0.27 |
| $K_2O$ | 0.79 | 0.25 | 0.25 | 0.16 | 0.10 |
| $Li_2O$ | 0.50 | 1.21 | 1.53 | 0.59 | 1.40 |
| MgO | 11.06 | 10.04 | 9.65 | 11.65 | 10.57 |
| $Na_2O$ | 0.52 | 0.25 | 0.57 | 0.35 | 0.15 |
| $SiO_2$ | 65.13 | 62.55 | 65.35 | 64.35 | 64.35 |
| $TiO_2$ | 0.20 | 0.00 | 0.00 | 0.00 | 0.00 |
| Total | 100.00 | 100.00 | 100.00 | 100.00 | 100.00 |
| $D_k$, 1 MHz | 5.43 | 5.57 | | 5.30 | 5.42 |
| $D_k$, 1 GHz | 5.33 | 5.48 | | 5.22 | 5.33 |
| $D_f$, 1 MHz | 0.0057 | 0.0033 | | 0.0031 | 0.0051 |
| $D_f$, 1 GHz | 0.0003 | 0.0001 | | 0.0008 | 0.0014 |
| $T_L$ (° C.) | 1231 | 1161 | 1196 | 1254 | 1193 |
| $T_F$ (° C.) | 1327 | 1262 | 1254 | 1312 | 1299 |
| $T_F - T_L$ (° C.) | 96 | 101 | 58 | 58 | 106 |
| $T_M$ (° C.) | 1703 | 1592 | 1641 | 1634 | 1633 |
| E (GPa) | 85.3 | 86.1 | 85.7 | 91.8 | 89.5 |
| Std E (GPa) | 0.4 | 0.6 | 2.5 | 1.7 | 1.5 |
| H (GPa) | 3.99 | 4.00 | 4.03 | 4.22 | 4.13 |
| Std H (GPa) | 0.01 | 0.02 | 0.09 | 0.08 | 0.05 |

| SAMPLES: | 21 | 22 | 23 | 24 | 25 | 26 |
|---|---|---|---|---|---|---|
| $Al_2O_3$ | 12.04 | 12.04 | 12.04 | 12.04 | 12.04 | 12.54 |
| $B_2O_3$ | 8.65 | 8.69 | 10.73 | 10.73 | 11.07 | 8.73 |
| CaO | 2.06 | 2.98 | 2.98 | 2.98 | 2.98 | 2.88 |
| $F_2$ | 0.45 | 0.45 | 0.45 | 0.45 | 0.45 | 2.00 |
| $Fe_2O_3$ | 0.35 | 0.35 | 0.35 | 0.35 | 0.35 | 0.35 |
| $K_2O$ | 0.4 | 0.4 | 0.4 | 0.4 | 0.4 | 0.40 |
| $Li_2O$ | 1.53 | 1.05 | 1.05 | 0.59 | 0.48 | |
| MgO | 10.47 | 10.62 | 9.97 | 11.26 | 11.26 | 11.26 |
| $Na_2O$ | 0.5 | 0.5 | 0.5 | 0.5 | 0.5 | 0.50 |
| $SiO_2$ | 63.05 | 62.42 | 61.03 | 60.2 | 59.97 | 61.34 |
| $TiO_2$ | 0.5 | 0.5 | 0.5 | 0.5 | 0.5 | |
| Total | 100.00 | 100.00 | 100.00 | 100.00 | 100.00 | 100.00 |
| $D_k$, 1 MHz | 5.75 | 5.73 | 5.61 | 5.64 | 5.63 | 5.35 |
| $D_k$, 1 GHz | 5.68 | 5.61 | 5.55 | 5.54 | 5.49 | 5.38 |
| $D_f$, 1 MHz | 0.004 | 0.0058 | 0.0020 | 0.0046 | 0.0040 | 0.0063 |

TABLE 6-continued

Some glass compositions useful in some embodiments of the present invention.

| | | | | | | |
|---|---|---|---|---|---|---|
| $D_f$, 1 GHz | 0.0021 | 0.0024 | 0.0034 | 0.0019 | 0.0023 | 0.0001 |
| $T_L$ (° C.) | 1185 | 1191 | 1141 | 1171 | 1149 | 1227 |
| $T_F$ (° C.) | 1256 | 1258 | 1244 | 1246 | 1249 | 1301 |
| $T_F - T_L$ (° C.) | 71 | 67 | 103 | 75 | 100 | |
| $T_M$ (° C.) | 1587 | 1581 | 1587 | 1548 | 1553 | |
| E (GPa) | | | | | | |
| Std E (GPa) | | | | | | |
| H (GPa) | | | | | | |
| Std H (GPa) | | | | | | |
| $\sigma_f$ (KPSI/GPa) | | | 475.7/ | 520.9/ | 466.5/ | 522.0 |
| | | | 3.28 | 3.59 | 3.22 | |
| Std $\sigma_f$ | | | 37.3/ | 18.3/ | 41.8/ | 18.70 |
| (KPSI/GPa) | | | 0.26 | 0.13 | 0.29 | |
| Density (g/cm³) | | | 2.4209* | 2.4324* | 2.4348* | |

TABLE 7

Some glass compositions useful in some embodiments of the present invention.

| | SAMPLES: | | |
|---|---|---|---|
| | 27 | 28 | E-Glass |
| $Al_2O_3$ | 12.42 | 12.57 | 13.98 |
| $B_2O_3$ | 9.59 | 8.59 | 5.91 |
| CaO | 0.11 | 0.10 | 22.95 |
| $F_2$ | 0.35 | 0.26 | 0.71 |
| $Fe_2O_3$ | 0.21 | 0.21 | 0.36 |
| $K_2O$ | 0.18 | 0.18 | 0.11 |
| $Li_2O$ | 0.80 | 1.01 | 0 |
| MgO | 10.25 | 10.41 | 0.74 |
| $Na_2O$ | 0.15 | 0.18 | 0.89 |
| $SiO_2$ | 65.47 | 65.96 | 54.15 |
| $TiO_2$ | 0.17 | 0.17 | 0.07 |
| $D_k$, 1 MHz | 5.3 | 5.4 | 7.3 |
| $D_k$, 1 GHz | 5.3 | 5.4 | 7.1 |
| $D_f$, 1 MHz | 0.003 | 0.008 | |
| $D_f$, 1 GHz | 0.011 | 0.012 | 0.0168 |
| $T_L$ (° C.) | 1184 | 1201 | 1079 |
| $T_F$ (° C.) | 1269 | 1282 | 1173 |
| $T_F - T_L$ (° C.) | 85 | 81 | 94 |
| E (GPa) | | | |
| H (GPa) | 3.195 | 3.694 | |

Samples 29-62 provide glass compositions (Table 8) by weight percentage: $SiO_2$ 53.74-76.97%, $B_2O_3$ 4.47-14.28%, $Al_2O_3$ 4.63-15.44%, MgO 4.20-12.16%, CaO 1.04-10.15%, $Li_2O$ 0.0-3.2%, $Na_2O$ 0.0-1.61%, $K_2O$ 0.01-0.05%, $Fe_2O_3$ 0.06-0.35%, $F_2$ 0.49-1.48%, $TiO_2$ 0.05-0.65%, and sulfate (expressed as $SO_3$) 0.0-0.16%.

Samples 29-62 provide glass compositions (Table 8) by weight percentage wherein the (MgO+CaO) content is 7.81-16.00%, the ratio CaO/MgO is 0.09-1.74%, the ($SiO_2 \pm B_2O_3$) content is 67.68-81.44%, the ratio $Al_2O_3/B_2O_3$ is 0.90-1.71%, the ($Li_2O+Na_2O+K_2O$) content is 0.03-3.38%, and the ratio $Li_2O/(Li_2O+Na_2O+K_2O)$ is 0.00-0.95%.

In terms of mechanical properties, the compositions of Table 8 have a fiber density of 2.331-2.416 g/cm³ and an average fiber tensile strength (or fiber strength) of 3050-3578 MPa.

To measure fiber tensile strength, fiber samples from the glass compositions were produced from a 10Rh/90Pt single tip fiber drawing unit. Approximately, 85 grams of cullet of a given composition was fed into the bushing melting unit and conditioned at a temperature close or equal to the 100 Poise melt viscosity for two hours. The melt was subsequently lowered to a temperature close or equal to the 1000 Poise melt viscosity and stabilized for one hour prior to fiber drawing. Fiber diameter was controlled to produce an approximately 10 μm diameter fiber by controlling the speed of the fiber drawing winder. All fiber samples were captured in air without any contact with foreign objects. The fiber drawing was completed in a room with a controlled humidity of between 40 and 45% RH.

Fiber tensile strength was measured using a Kawabata KES-G1 (Kato Tech Co. Ltd., Japan) tensile strength analyzer equipped with a Kawabata type C load cell. Fiber samples were mounted on paper framing strips using a resin adhesive. A tensile force was applied to the fiber until failure, from which the fiber strength was determined based on the fiber diameter and breaking stress. The test was done at room temperature under the controlled humidity between 40-45% RH. The average values and standard deviations were computed based on a sample size of 65-72 fibers for each composition.

The glasses were found to have $D_k$ of 4.83-5.67 and $D_f$ of 0.003-0.007 at 1 GHz. The electric properties of the compositions in Table 8 illustrate significantly lower (i.e., improved) $D_k$ and $D_f$ over standard E-glass which has a $D_k$ of 7.14 and a $D_f$ of 0.0168 at 1 GHz.

In terms of fiber forming properties, the compositions in Table 8 have forming temperatures ($T_F$) of 1247-1439° C. and forming windows ($T_F$-$T_L$) of 53-243° C. The compositions in Table 8 have liquidus temperature ($T_L$) of 1058-1279° C. This can be compared to a standard E-glass which has $T_F$ typically in the range 1170-1215° C. To prevent glass devitrification in fiber forming, a forming window ($T_F$-$T_L$) greater than 55° C. is sometimes desirable. All of the compositions in Table 8 exhibit satisfactory forming windows.

TABLE 8

Some glass compositions useful in some embodiments of the present invention.

| wt % | 29 | 30 | 31 | 32 | 33 |
|---|---|---|---|---|---|
| $SiO_2$ | 64.24 | 58.62 | 57.83 | 61.00 | 61.56 |
| $Al_2O_3$ | 11.54 | 12.90 | 12.86 | 12.87 | 12.82 |
| $Fe_2O_3$ | 0.28 | 0.33 | 0.33 | 0.33 | 0.32 |

TABLE 8-continued

Some glass compositions useful in some embodiments of the present invention.

| | | | | | |
|---|---|---|---|---|---|
| CaO | 1.70 | 1.04 | 2.48 | 2.48 | 1.08 |
| MgO | 11.69 | 11.63 | 12.16 | 9.31 | 10.69 |
| $Na_2O$ | 0.01 | 0.00 | 0.00 | 0.00 | 0.00 |
| $K_2O$ | 0.03 | 0.03 | 0.03 | 0.03 | 0.03 |
| $B_2O_3$ | 8.96 | 14.28 | 13.15 | 12.81 | 12.30 |
| $F_2$ | 0.53 | 0.62 | 0.61 | 0.61 | 0.65 |
| $TiO_2$ | 0.40 | 0.54 | 0.54 | 0.54 | 0.54 |
| $Li_2O$ | 0.60 | 0.00 | 0.00 | 0.00 | 0.00 |
| $SO_3$ | 0.01 | 0.01 | 0.01 | 0.01 | 0.01 |
| Total | 100.00 | 100.00 | 100.00 | 100.00 | 100.00 |
| (MgO + CaO) | 13.39 | 12.67 | 14.64 | 11.79 | 11.77 |
| CaO/Mg | 0.15 | 0.09 | 0.20 | 0.27 | 0.10 |
| MgO/(MgO + CaO) | 0.87 | 0.92 | 0.83 | 0.79 | 0.91 |
| $SiO_2 + B_2O_3$ | 73.20 | 72.90 | 70.98 | 73.81 | 73.86 |
| $Al_2O_3/B_2O_3$ | 1.29 | 0.90 | 0.98 | 1.00 | 1.04 |
| $(Li_2O + Na_2O + K_2O)$ | 0.64 | 0.03 | 0.03 | 0.03 | 0.03 |
| $Li_2O/(Li_2O + Na_2O + K_2O)$ | 0.94 | 0.00 | 0.00 | 0.00 | 0.00 |
| $T_L$ (° C.) | 1196 | 1228 | 1205 | 1180 | 1249 |
| $T_F$ (° C.) | 1331 | 1300 | 1258 | 1334 | 1332 |
| $T_F - T_L$ (° C.) | 135 | 72 | 53 | 154 | 83 |
| $D_k$ @ 1 GHz | 5.26 | *** | *** | 5.30 | *** |
| $D_f$ @ 1 GHz | 0.0017 | *** | *** | 0.001 | *** |
| Fiber density (g/cm³) | *** | *** | *** | *** | *** |
| Fiber strength (MPa) | *** | *** | *** | *** | *** |

| wt % | 34 | 35 | 36 | 37 | 38 |
|---|---|---|---|---|---|
| $SiO_2$ | 63.83 | 65.21 | 66.70 | 60.02 | 53.74 |
| $Al_2O_3$ | 10.97 | 10.56 | 10.11 | 12.32 | 15.44 |
| $Fe_2O_3$ | 0.26 | 0.25 | 0.24 | 0.29 | 0.24 |
| CaO | 2.38 | 2.29 | 2.19 | 4.01 | 3.83 |
| MgO | 10.64 | 10.23 | 9.79 | 9.95 | 10.53 |
| $Na_2O$ | 0.29 | 0.28 | 0.27 | 0.33 | 0.09 |
| $K_2O$ | 0.03 | 0.03 | 0.03 | 0.03 | 0.03 |
| $B_2O_3$ | 9.32 | 8.96 | 8.57 | 10.48 | 13.94 |
| $F_2$ | 1.20 | 1.16 | 1.11 | 1.35 | 1.48 |
| $TiO_2$ | 0.36 | 0.35 | 0.33 | 0.41 | 0.65 |
| $Li_2O$ | 0.70 | 0.67 | 0.64 | 0.79 | 0.02 |
| $SO_3$ | 0.14 | 0.14 | 0.13 | 0.16 | 0.14 |
| Total | 100.13 | 100.13 | 100.12 | 100.15 | 100.13 |
| (MgO + CaO) | 13.02 | 12.52 | 11.98 | 13.96 | 14.36 |
| CaO/MgO | 0.22 | 0.22 | 0.22 | 0.40 | 0.36 |
| MgO/(MgO + CaO) | 0.82 | 0.82 | 0.82 | 0.71 | 0.73 |
| $SiO_2 + B_2O_3$ | 73.15 | 74.17 | 75.27 | 70.50 | 67.68 |
| $Al_2O_3/B_2O_3$ | 1.18 | 1.18 | 1.18 | 1.18 | 1.11 |
| $(Li_2O + Na_2O + K_2O)$ | 1.02 | 0.98 | 0.94 | 1.15 | 0.14 |
| $Li_2O/(Li_2O + Na_2O + K_2O)$ | 0.69 | 0.68 | 0.68 | 0.69 | 0.16 |
| $T_L$ (° C.) | 1255 | 1267 | 1279 | 1058 | 1175 |
| $T_F$ (° C.) | 1313 | 1320 | 1333 | 1266 | 1247 |
| $T_F - T_L$ (° C.) | 58 | 53 | 54 | 208 | 72 |
| $D_k$ @ 1 GHz | *** | 5.46 | 5.43 | 5.56 | 5.57 |
| $D_f$ @ 1 GHz | *** | 0.0036 | 0.0020 | 0.0025 | 0.00437 |
| Fiber density (g/cm³) | 2.402 | 2.408 | 2.352 | 2.416 | *** |
| Fiber strength (MPa) | 3310 | 3354 | 3369 | 3413 | *** |

| wt % | 39 | 40 | 41 | 42 | 43 |
|---|---|---|---|---|---|
| $SiO_2$ | 62.54 | 63.83 | 65.21 | 66.70 | 59.60 |
| $Al_2O_3$ | 11.36 | 10.97 | 10.56 | 10.11 | 13.52 |
| $Fe_2O_3$ | 0.27 | 0.26 | 0.25 | 0.24 | 0.33 |
| CaO | 2.47 | 2.38 | 2.29 | 2.19 | 1.80 |
| MgO | 11.02 | 10.64 | 10.23 | 9.79 | 9.77 |
| $Na_2O$ | 0.31 | 0.29 | 0.28 | 0.27 | 0.10 |
| $K_2O$ | 0.03 | 0.03 | 0.03 | 0.03 | 0.03 |
| $B_2O_3$ | 9.65 | 9.32 | 8.96 | 8.57 | 12.70 |
| $F_2$ | 1.25 | 1.20 | 1.16 | 1.11 | 1.21 |
| $TiO_2$ | 0.37 | 0.36 | 0.35 | 0.33 | 0.51 |
| $Li_2O$ | 0.73 | 0.70 | 0.67 | 0.64 | 0.41 |
| $SO_3$ | 0.15 | 0.14 | 0.14 | 0.13 | 0.15 |
| Total | 100.14 | 100.13 | 100.13 | 100.12 | 100.14 |
| (MgO + CaO) | 13.49 | 13.02 | 12.52 | 11.98 | 11.57 |
| CaO/MgO | 0.22 | 0.22 | 0.22 | 0.22 | 0.18 |
| MgO/(MgO + CaO) | 0.82 | 0.82 | 0.82 | 0.82 | 0.84 |
| $SiO_2 + B_2O_3$ | 72.19 | 73.15 | 74.17 | 75.27 | 72.30 |
| $Al_2O_3/B_2O_3$ | 1.18 | 1.18 | 1.18 | 1.18 | 1.06 |

TABLE 8-continued

Some glass compositions useful in some embodiments of the present invention.

| | | | | | |
|---|---|---|---|---|---|
| (Li$_2$O + Na$_2$O + K$_2$O) | 1.07 | 1.02 | 0.98 | 0.94 | 0.54 |
| Li$_2$O/(Li$_2$O + Na$_2$O + K$_2$O) | 0.68 | 0.69 | 0.68 | 0.68 | 0.76 |
| T$_L$ (° C.) | 1238 | 1249 | 1266 | 1276 | 1083 |
| T$_F$ (° C.) | 1293 | 1313 | 1342 | 1368 | 1310 |
| T$_F$ − T$_L$ (° C.) | 55 | 64 | 76 | 92 | 227 |
| D$_k$ @ 1 GHz | 5.45 | 5.31 | 5.39 | 5.25 | 5.20 |
| D$_f$ @ 1 GHz | 0.00531 | 0.00579 | 0.00525 | 0.00491 | 0.00302 |
| Fiber density (g/cm$^3$) | 2.403 | *** | *** | *** | *** |
| Fiber strength (MPa) | 3467 | *** | *** | *** | *** |

| wt % | 44 | 45 | 46 | 47 | 48 |
|---|---|---|---|---|---|
| SiO$_2$ | 59.90 | 60.45 | 62.68 | 65.30 | 65.06 |
| Al$_2$O$_3$ | 13.23 | 13.06 | 12.28 | 11.51 | 12.58 |
| Fe$_2$O$_3$ | 0.34 | 0.35 | 0.20 | 0.19 | 0.25 |
| CaO | 1.86 | 1.58 | 1.65 | 1.39 | 1.25 |
| MgO | 10.14 | 10.50 | 8.74 | 8.18 | 6.56 |
| Na$_2$O | 0.10 | 0.10 | 0.10 | 0.09 | 0.13 |
| K$_2$O | 0.03 | 0.03 | 0.02 | 0.02 | 0.05 |
| B$_2$O$_3$ | 12.40 | 12.29 | 12.69 | 11.89 | 10.03 |
| F$_2$ | 1.26 | 1.07 | 1.11 | 0.94 | 0.82 |
| TiO$_2$ | 0.53 | 0.55 | 0.51 | 0.48 | 0.07 |
| Li$_2$O | 0.20 | 0.00 | 0.00 | 0.00 | 3.20 |
| SO$_3$ | 0.15 | 0.16 | 0.15 | 0.14 | 0.11 |
| Total | 100.14 | 100.15 | 100.14 | 100.13 | 100.10 |
| RO (MgO + CaO) | 12.00 | 12.08 | 10.39 | 9.57 | 7.81 |
| CaO/Mg | 0.18 | 0.15 | 0.19 | 0.17 | 0.19 |
| MgO/(MgO + CaO) | 0.85 | 0.87 | 0.84 | 0.85 | 0.84 |
| SiO$_2$ + B$_2$O$_3$ | 72.30 | 72.74 | 75.37 | 77.19 | 75.09 |
| Al$_2$O$_3$/B$_2$O$_3$ | 1.07 | 1.06 | 0.97 | 0.97 | 1.25 |
| (Li$_2$O + Na$_2$O + K$_2$O) | 0.33 | 0.13 | 0.12 | 0.11 | 3.38 |
| Li$_2$O/(Li$_2$O + Na$_2$O + K$_2$O) | 0.61 | 0.00 | 0.00 | 0.00 | 0.95 |
| T$_L$ (° C.) | 1129 | 1211 | 1201 | 1196 | *** |
| T$_F$ (° C.) | 1303 | 1378 | 1378 | 1439 | *** |
| T$_F$ − T$_L$ (° C.) | 174 | 167 | 177 | 243 | *** |
| Dk @ 1 GHz | 5.24 | 5.05 | 4.94 | 4.83 | 5.67 |
| Df @ 1 GHz | 0.00473 | 0.00449 | 0.00508 | 0.00254 | 0.007 |
| Fiber density (g/cm$^3$) | 2.387 | 2.385 | 2.354 | 2.34 | 2.345 |
| Fiber strength (MPa) | 3483 | 3362 | 3166 | 3050 | 3578 |

| wt % | 49 | 50 | 51 | 52 | 53 |
|---|---|---|---|---|---|
| SiO$_2$ | 61.14 | 60.83 | 62.45 | 61.88 | 66.25 |
| Al$_2$O$_3$ | 12.90 | 13.02 | 12.52 | 12.72 | 10.60 |
| Fe$_2$O$_3$ | 0.27 | 0.28 | 0.26 | 0.28 | 0.18 |
| CaO | 1.72 | 1.74 | 1.59 | 1.63 | 3.33 |
| MgO | 9.25 | 9.36 | 8.98 | 9.13 | 5.98 |
| Na$_2$O | 0.10 | 0.10 | 0.10 | 0.10 | 0.86 |
| K$_2$O | 0.03 | 0.03 | 0.03 | 0.03 | 0.02 |
| B$_2$O$_3$ | 12.70 | 12.70 | 12.29 | 12.38 | 11.44 |
| F$_2$ | 1.16 | 1.17 | 1.08 | 1.10 | 0.90 |
| TiO$_2$ | 0.51 | 0.51 | 0.50 | 0.50 | 0.44 |
| Li$_2$O | 0.21 | 0.25 | 0.21 | 0.25 | 0.00 |
| SO$_3$ | 0.15 | 0.15 | 0.14 | 0.14 | 0.00 |
| Total | 100.14 | 100.14 | 100.13 | 100.13 | 100.00 |
| (MgO + CaO) | 10.97 | 11.10 | 10.57 | 10.76 | 9.31 |
| CaO/Mg | 0.19 | 0.19 | 0.18 | 0.18 | 0.56 |
| MgO/(MgO + CaO) | 0.84 | 0.84 | 0.85 | 0.85 | 0.64 |
| SiO$_2$ + B$_2$O$_3$ | 73.84 | 73.53 | 74.74 | 74.26 | 77.69 |
| Al$_2$O$_3$/B$_2$O$_3$ | 1.02 | 1.03 | 1.02 | 1.03 | 0.93 |
| (Li$_2$O + Na$_2$O + K$_2$O) | 0.34 | 0.38 | 0.34 | 0.38 | 0.88 |
| Li$_2$O/(Li$_2$O + Na$_2$O + K$_2$O) | 0.62 | 0.66 | 0.62 | 0.66 | 0.00 |
| T$_L$ (° C.) | 1179 | 1179 | 1186 | 1191 | *** |
| T$_F$ (° C.) | 1342 | 1340 | 1374 | 1366 | *** |
| T$_F$ − T$_L$ (° C.) | 163 | 161 | 188 | 175 | *** |
| D$_k$ @ 1 GHz | *** | 5.24 | 4.96 | 5.06 | 5.03 |
| D$_f$ @ 1 GHz | *** | 0.0018 | 0.0015 | 0.0014 | 0.0027 |
| Fiber density (g/cm$^3$) | 2.358 | 2.362 | 2.338 | *** | 2.331 |
| Fiber strength (MPa) | 3545 | 3530 | 3234 | *** | 3161 |

| wt % | 54 | 55 | 56 | 57 | 58 |
|---|---|---|---|---|---|
| SiO$_2$ | 66.11 | 69.19 | 70.68 | 69.44 | 69.40 |
| Al$_2$O$_3$ | 10.58 | 10.37 | 8.87 | 7.20 | 7.21 |
| Fe$_2$O$_3$ | 0.18 | 0.18 | 0.16 | 0.13 | 0.14 |
| CaO | 5.31 | 5.20 | 5.50 | 5.57 | 10.15 |

TABLE 8-continued

Some glass compositions useful in some embodiments of the present invention.

| | | | | | |
|---|---|---|---|---|---|
| MgO | 4.20 | 7.13 | 7.54 | 10.39 | 5.85 |
| $Na_2O$ | 0.86 | 0.55 | 0.59 | 0.59 | 0.59 |
| $K_2O$ | 0.02 | 0.02 | 0.02 | 0.02 | 0.02 |
| $B_2O_3$ | 11.41 | 6.39 | 5.72 | 5.80 | 5.79 |
| $F_2$ | 0.90 | 0.53 | 0.55 | 0.55 | 0.55 |
| $TiO_2$ | 0.44 | 0.43 | 0.37 | 0.30 | 0.30 |
| $Li_2O$ | 0.00 | 0.00 | 0.00 | 0.00 | 0.00 |
| $SO_3$ | 0.00 | 0.00 | 0.00 | 0.00 | 0.00 |
| Total | 100.00 | 100.00 | 100.00 | 100.00 | 100.00 |
| (MgO + CaO) | 9.51 | 12.33 | 13.04 | 15.96 | 16.00 |
| CaO/Mg | 1.26 | 0.73 | 0.73 | 0.54 | 1.74 |
| MgO/(MgO + CaO) | 0.44 | 0.58 | 0.58 | 0.65 | 0.37 |
| $SiO_2 + B_2O_3$ | 77.52 | 75.58 | 76.40 | 75.24 | 75.19 |
| $Al_2O_3/B_2O_3$ | 0.93 | 1.62 | 1.55 | 1.24 | 1.25 |
| $(Li_2O + Na_2O + K_2O)$ | 0.88 | 0.57 | 0.61 | 0.61 | 0.61 |
| $Li_2O/(Li_2O + Na_2O + K_2O)$ | 0.00 | 0.00 | 0.00 | 0.00 | 0.00 |
| $T_L$ (° C.) | *** | *** | *** | *** | *** |
| $T_F$ (° C.) | *** | *** | *** | *** | *** |
| $T_F - T_L$ (° C.) | *** | *** | *** | *** | *** |
| $D_k$ @ 1 GHz | *** | *** | *** | *** | *** |
| $D_f$ @ 1 GHz | *** | *** | *** | *** | *** |
| Fiber density (g/cm³) | 2.341 | *** | *** | *** | *** |
| Fiber strength (MPa) | 3372 | *** | *** | *** | *** |

| wt % | 59 | 60 | 61 | 62 |
|---|---|---|---|---|
| $SiO_2$ | 69.26 | 71.45 | 74.07 | 76.97 |
| $Al_2O_3$ | 8.72 | 5.30 | 7.27 | 4.63 |
| $Fe_2O_3$ | 0.13 | 0.06 | 0.09 | 0.10 |
| CaO | 4.89 | 5.24 | 4.88 | 5.69 |
| MgO | 9.92 | 10.63 | 4.77 | 5.56 |
| $Na_2O$ | 0.53 | 0.58 | 0.73 | 1.61 |
| $K_2O$ | 0.03 | 0.02 | 0.03 | 0.01 |
| $B_2O_3$ | 5.09 | 4.96 | 6.39 | 4.47 |
| $F_2$ | 0.49 | 0.50 | 0.66 | 0.77 |
| $TiO_2$ | 0.27 | 0.05 | 0.17 | 0.19 |
| $Li_2O$ | 0.69 | 1.20 | 0.95 | 0.00 |
| $SO_3$ | 0.00 | 0.00 | 0.00 | 0.00 |
| Total | 100.00 | 100.00 | 100.00 | 100.00 |
| (MgO + CaO) | 14.81 | 15.87 | 9.65 | 11.25 |
| CaO/Mg | 0.49 | 0.49 | 1.02 | 1.02 |
| MgO/(MgO + CaO) | 0.67 | 0.67 | 0.49 | 0.49 |
| $SiO_2 + B_2O_3$ | 74.35 | 76.41 | 80.46 | 81.44 |
| $Al_2O_3/B_2O_3$ | 1.71 | 1.07 | 1.14 | 1.04 |
| $(Li_2O + Na_2O + K_2O)$ | 1.25 | 1.80 | 1.71 | 1.62 |
| $Li_2O/(Li_2O + Na_2O + K_2O)$ | 0.55 | 0.67 | 0.56 | 0.00 |
| $T_L$ (° C.) | *** | *** | *** | *** |
| $T_F$ (° C.) | 1358/1355 | 1331/1333 | 1493/1484 | *** |
| $T_F - T_L$ (° C.) | *** | *** | *** | *** |
| $D_k$ @ 1 GHz | *** | *** | *** | *** |
| $D_f$ @ 1 GHz | *** | *** | *** | *** |
| Fiber density (g/cm³) | *** | *** | *** | *** |
| Fiber strength (MPa) | *** | *** | *** | *** |

Samples 63-73 provide glass compositions (Table 9) by weight percentage: $SiO_2$ 62.35-68.35%, $B_2O_3$ 6.72-8.67%, $Al_2O_3$ 10.53-18.04%, MgO 8.14-11.44%, CaO 1.67-2.12%, $Li_2O$ 1.07-1.38%, $Na_2O$ 0.02%, $K_2O$ 0.03-0.04%, $Fe_2O_3$ 0.23-0.33%, $F_2$ 0.49-0.60%, $TiO_2$ 0.26-0.61%, and sulfate (expressed as $SO_3$) 0.0%.

Samples 63-73 provide glass compositions (Table 9) by weight percentage wherein the (MgO+CaO) content is 9.81-13.34%, the ratio CaO/MgO is 0.16-0.20, the ($SiO_2+B_2O_3$) content is 69.59-76.02%, the ratio $Al_2O_3/B_2O_3$ is 1.37-2.69, the ($Li_2O+Na_2O+K_2O$) content is 1.09-1.40%, and the ratio $Li_2O/(Li_2O+Na_2O+K_2O)$ is 0.98.

In terms of mechanical properties, the compositions of Table 9 have a fiber density of 2.371-2.407 g/cm³ and an average fiber tensile strength (or fiber strength) of 3730-4076 MPa. The fiber tensile strengths for the fibers made from the compositions of Table 9 were measured in the same way as the fiber tensile strengths measured in connection with the compositions of Table 8.

The fibers formed from the compositions were found to have Young's modulus (E) values ranging from 73.84-81.80 GPa. The Young's modulus (E) values for the fibers were measured using the sonic modulus method on fibers. Elastic modulus values for the fibers drawn from glass melts having the recited compositions were determined using an ultrasonic acoustic pulse technique on a Panatherm 5010 instrument from Panametrics, Inc. of Waltham, Mass. Extensional wave reflection time was obtained using twenty micro-second duration, 200 kHz pulses. The sample length was measured and the respective extensional wave velocity ($V_E$) was calculated. Fiber density (ρ) was measured using a Micromeritics AccuPyc 1330 pycnometer. In general, 20 measurements were made for each composition and the average Young's modulus (E) was calculated according to the formula $E=V_E^{2}*\rho$. The fiber failure strain was calculated using Hooke's Law based on the known fiber strength and Young's modulus values.

The glasses were found to have $D_k$ of 5.20-5.54 and Df of 0.0010-0.0020 at 1 GHz. The electric properties of the compositions in Table 9 illustrate significantly lower (i.e., improved) $D_k$ and $D_f$ over standard E-glass with $D_k$ of 7.14 and $D_f$ of 0.0168 at 1 GHz.

In terms of fiber forming properties, the compositions in Table 9 have forming temperatures ($T_F$) of 1303-1388° C. and forming windows ($T_F$-$T_L$) of 51-144° C.

TABLE 9

Some glass compositions useful in some embodiments of the present invention.

| wt % | 63 | 64 | 65 | 66 | 67 |
|---|---|---|---|---|---|
| $SiO_2$ | 64.25 | 65.35 | 66.38 | 67.35 | 68.35 |
| $Al_2O_3$ | 11.88 | 11.52 | 11.18 | 10.86 | 10.53 |
| $Fe_2O_3$ | 0.26 | 0.25 | 0.24 | 0.24 | 0.23 |
| CaO | 2.12 | 2.05 | 1.99 | 1.93 | 1.87 |
| MgO | 10.50 | 10.17 | 9.87 | 9.58 | 9.29 |
| $Na_2O$ | 0.02 | 0.02 | 0.02 | 0.02 | 0.02 |
| $K_2O$ | 0.04 | 0.03 | 0.03 | 0.03 | 0.03 |
| $B_2O_3$ | 8.67 | 8.40 | 8.15 | 7.91 | 7.67 |
| $F_2$ | 0.60 | 0.58 | 0.56 | 0.54 | 0.53 |
| $TiO_2$ | 0.30 | 0.29 | 0.28 | 0.27 | 0.26 |
| $Li_2O$ | 1.38 | 1.33 | 1.29 | 1.26 | 1.22 |
| $SO_3$ | 0.00 | 0.00 | 0.00 | 0.00 | 0.00 |
| Total | 100.00 | 100.00 | 100.00 | 100.00 | 100.00 |
| (MgO + CaO) | 12.61 | 12.22 | 11.86 | 11.51 | 11.16 |
| CaO/MgO | 0.20 | 0.20 | 0.20 | 0.20 | 0.20 |
| MgO/(MgO + CaO) | 0.83 | 0.83 | 0.83 | 0.83 | 0.83 |
| $SiO_2 + B_2O_3$ | 72.92 | 73.75 | 74.53 | 75.26 | 76.02 |
| $Al_2O_3/B_2O_3$ | 1.37 | 1.37 | 1.37 | 1.37 | 1.37 |
| ($Li_2O + Na_2O + K_2O$) | 1.40 | 1.36 | 1.32 | 1.28 | 1.24 |
| $Li_2O/(Li_2O + Na_2O + K_2O)$ | 0.98 | 0.98 | 0.98 | 0.98 | 0.98 |
| $T_L$ (° C.) | 1241 | 1259 | 1266 | 1268 | 1287 |
| $T_F$ (° C.) | 1306 | 1329 | 1349 | 1374 | 1388 |
| $T_F - T_L$ (° C.) | 65 | 70 | 83 | 106 | 101 |
| $D_k$ @ 1 GHz | 5.44 | 5.35 | 5.29 | 5.31 | 5.2 |
| $D_f$ @ 1 GHz | 0.0013 | 0.0016 | 0.001 | 0.002 | 0.0013 |
| Fiber density (g/cm³) | 2.395 | 2.385 | 2.384 | 2.375 | 2.371 |
| Fiber strength (MPa) | 3730 | 3759 | 3813 | 3743 | 3738 |
| Young's Modulus (GPa) | *** | *** | *** | 74.25 | *** |
| Fiber failure strain (%) | *** | *** | *** | 5.04 | *** |

| wt % | 68 | 69 | 70 | 71 | 72 | 73 |
|---|---|---|---|---|---|---|
| $SiO_2$ | 64.39 | 63.63 | 62.87 | 65.45 | 65.61 | 62.35 |
| $Al_2O_3$ | 14.05 | 16.04 | 18.04 | 11.05 | 14.29 | 14.74 |
| $Fe_2O_3$ | 0.28 | 0.30 | 0.33 | 0.24 | 0.28 | 0.29 |
| CaO | 1.90 | 1.79 | 1.67 | 1.91 | 1.77 | 1.79 |
| MgO | 9.39 | 8.77 | 8.14 | 11.44 | 8.72 | 11.37 |
| $Na_2O$ | 0.02 | 0.02 | 0.02 | 0.02 | 0.02 | 0.02 |
| $K_2O$ | 0.04 | 0.04 | 0.04 | 0.03 | 0.04 | 0.04 |
| $B_2O_3$ | 7.75 | 7.23 | 6.72 | 7.80 | 7.19 | 7.28 |
| $F_2$ | 0.54 | 0.51 | 0.49 | 0.54 | 0.51 | 0.51 |
| $TiO_2$ | 0.41 | 0.51 | 0.61 | 0.28 | 0.43 | 0.45 |
| $Li_2O$ | 1.23 | 1.15 | 1.07 | 1.24 | 1.14 | 1.16 |
| $SO_3$ | 0.00 | 0.00 | 0.00 | 0.00 | 0.00 | 0.00 |
| Total | 100.00 | 100.00 | 100.00 | 100.00 | 100.00 | 100.00 |
| (MgO + CaO) | 11.29 | 10.55 | 9.81 | 13.34 | 10.49 | 13.16 |
| CaO/MgO | 0.20 | 0.20 | 0.20 | 0.17 | 0.20 | 0.16 |
| MgO/(MgO + CaO) | 0.83 | 0.83 | 0.83 | 0.86 | 0.83 | 0.86 |
| $SiO_2 + B_2O_3$ | 72.14 | 70.87 | 69.59 | 73.25 | 72.80 | 69.63 |
| $Al_2O_3/B_2O_3$ | 1.81 | 2.22 | 2.69 | 1.42 | 1.99 | 2.02 |
| ($Li_2O + Na_2O + K_2O$) | 1.25 | 1.17 | 1.09 | 1.26 | 1.16 | 1.18 |
| $Li_2O/(Li_2O + Na_2O + K_2O)$ | 0.98 | 0.98 | 0.98 | 0.98 | 0.98 | 0.98 |
| $T_L$ (° C.) | 1231 | 1219 | 1236 | 1266 | 1235 | 1220 |
| $T_F$ (° C.) | 1349 | 1362 | 1368 | 1317 | 1379 | 1303 |
| $T_F - T_L$ (° C.) | 118 | 143 | 132 | 51 | 144 | 83 |
| $D_k$ @ 1 GHz | 5.4 | 5.38 | 5.39 | 5.54 | 5.52 | 5.58 |
| $D_f$ @ 1 GHz | 0.0016 | 0.0013 | 0.002 | 0.0015 | 0.0016 | 0.0015 |
| Fiber density (g/cm³) | 2.393 | 2.398 | 2.407 | *** | *** | *** |
| Fiber strength (MPa) | 3954 | 3977 | 4076 | *** | *** | *** |
| Young's Modulus (GPa) | 73.84 | 80.34 | 81.57 | 80.69 | 81.80 | *** |
| Fiber failure strain (%) | 5.36 | 4.95 | 5.00 | 4.68 | 4.72 | *** |

Desirable characteristics that can be exhibited by various but not necessarily all embodiments of the present invention can include, but are not limited to, the following: the provision of glass fibers, fiber glass strands, glass fiber fabrics, composites, and laminates having a relatively low density; the provision of glass fibers, fiber glass strands, glass fiber fabrics, composites, and laminates having a relatively high modulus; the provision of glass fibers, fiber glass strands, glass fiber fabrics, composites, and laminates having a relatively high strain-to-failure; the provision of glass fibers, fiber glass strands, glass fiber fabrics, composites, laminates, and prepregs useful for reinforcement applications; and the provision of glass fibers, fiber glass strands, glass fiber fabrics, composites, laminates, and prepregs having relatively low cost compared to other glass fibers, fiber glass strands, glass fiber fabrics, composites, laminates, and prepregs for reinforcement applications.

Various embodiments of the invention have been described in fulfillment of the various objectives of the invention. It should be recognized that these embodiments are merely illustrative of the principles of the present invention. Numerous modifications and adaptations thereof will be readily apparent to those of skill in the art without departing from the spirit and scope of the invention.

That which is claimed:

1. A fabric wherein at least one of a warp yarn or a fill yarn comprises: a fiber glass strand comprising a plurality of glass fibers comprising a glass composition that comprises the following components:

| | |
|---|---|
| $SiO_2$ | 60-68 weight percent; |
| $B_2O_3$ | 7-12 weight percent; |
| $Al_2O_3$ | 9-15 weight percent; |
| MgO | 8-15 weight percent; |
| CaO | 0-4 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the $Li_2O$ content is greater than either the $Na_2O$ content or the $K_2O$ content.

2. The fabric of claim 1, wherein the plurality of glass fibers have a diameter between about 5 and about 13 μm.

3. The fabric of claim 1 wherein at least one fill yarn comprises the fiber glass strand.

4. The fabric of claim 1 wherein at least one warp yarn comprises the fiber glass strand.

5. The fabric of claim 1 wherein:
at least one fill yarn comprises the fiber glass strand, and
at least one warp yarn comprises the fiber glass strand.

6. The fabric of claim 5, wherein the fabric comprises a plain weave fabric, a twill fabric, a crowfoot fabric, a satin weave fabric, a stitch bonded fabric, or a 3D woven fabric.

7. A composite comprising:
a polymeric resin; and
at least one fabric according to claim 1.

8. The composite of claim 7, wherein the polymeric resin comprises an epoxy resin.

9. The composite of claim 7, wherein the polymeric resin comprises at least one of polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins.

10. The composite of claim 7, wherein the fabric comprises a plain weave fabric, a twill fabric, a crowfoot fabric, a satin weave fabric, a stitch bonded fabric, or a 3D woven fabric.

11. An aerospace composite comprising the composite according to claim 7.

12. An aviation composite comprising the composite according to claim 7.

13. A radome comprising the composite according to claim 7.

14. A prepreg comprising:
a polymeric resin; and
a fabric according to claim 1.

15. A fiber-metal laminate comprising:
the prepreg according to claim 14;
a first metal sheet adhesively secured to one surface of the prepreg; and
a second metal sheet adhesively secured to a second surface of the prepreg, such that the prepreg is positioned between the two metal sheets.

16. The fiber-metal laminate according to claim 15, further comprising a second prepreg according to claim 14 and a third metal sheet, wherein the second prepreg is positioned between the second metal sheet and the third metal sheet.

17. The fiber-metal laminate of claim 15, wherein the metal sheets comprise aluminum.

18. The fiber-metal laminate of claim 15, wherein the polymeric resin comprises epoxy.

19. A laminate comprising:
a polymeric resin; and
a fabric according to claim 1.

20. A fabric of claim 1 wherein the $B_2O_3$ component of the fiber glass strand comprises no more than 10% of the total weight percent of the glass composition.

21. A fabric wherein at least one of a warp yarn or a fill yarn comprises: a fiber glass strand comprising a plurality of glass fibers comprising a glass composition that comprises the following components:

| | |
|---|---|
| $SiO_2$ | 60-68 weight percent; |
| $B_2O_3$ | 7-10 weight percent; |
| $Al_2O_3$ | 9-15 weight percent; |
| MgO | 8-15 weight percent; |
| CaO | 0-4 weight percent; |
| $Li_2O$ | >0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the $Li_2O$ content is greater than either the $Na_2O$ content or the $K_2O$ content.

22. A fabric wherein at least one of a warp yarn or a fill yarn comprises: a fiber glass strand comprising a plurality of glass fibers comprising a glass composition that comprises the following components:

| | |
|---|---|
| $SiO_2$ | 60-68 weight percent; |
| $B_2O_3$ | 7-10 weight percent; |
| $Al_2O_3$ | 9-15 weight percent; |
| MgO | 8-15 weight percent; |
| CaO | 0-4 weight percent; |
| $Li_2O$ | 0-2 weight percent; |

-continued

| | |
|---|---|
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent; and |
| other constituents | 0-5 weight percent total; | wherein the ($Li_2O+Na_2O+K_2O$) content is less than 2 weight percent and wherein the MgO content is at least twice the content of CaO on a weight percent basis.

* * * * *